US012126066B2

United States Patent
Hill et al.

(10) Patent No.: US 12,126,066 B2
(45) Date of Patent: *Oct. 22, 2024

(54) LOW TEMPERATURE CO-FIREABLE DIELECTRIC MATERIALS

(71) Applicant: Skyworks Solutions, Inc., Irvine, CA (US)

(72) Inventors: Michael David Hill, Emmitsburg, MD (US); Jianzhong Jiang, Leesburg, VA (US); Jeffrey Alan Shunkwiler, Adamstown, MD (US); Neil Bruce Coats, Walkersville, MD (US); David Martin Firor, Thurmont, MD (US); David Bowie Cruickshank, Rockville, MD (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/213,449

(22) Filed: Jun. 23, 2023

(65) Prior Publication Data
US 2024/0030577 A1 Jan. 25, 2024

Related U.S. Application Data

(63) Continuation of application No. 17/364,325, filed on Jun. 30, 2021, now Pat. No. 11,715,869, which is a
(Continued)

(51) Int. Cl.
*B32B 3/00* (2006.01)
*B32B 18/00* (2006.01)
(Continued)

(52) U.S. Cl.
CPC ............... *H01P 1/36* (2013.01); *B32B 18/00* (2013.01); *C04B 35/265* (2013.01);
(Continued)

(58) Field of Classification Search
CPC ............... B32B 18/00; H01P 1/36; H01P 1/38
See application file for complete search history.

(56) References Cited

U.S. PATENT DOCUMENTS

| 3,781,704 A | 12/1973 | De Gruyl |
| 3,851,279 A | 11/1974 | Andrikian |

(Continued)

FOREIGN PATENT DOCUMENTS

| CN | 101910088 A | 12/2010 |
| CN | 101981753 A | 2/2011 |

(Continued)

OTHER PUBLICATIONS

Preparation of Ceramics in Low Temperature Sintered Microwave Medium, Studies in Structure and Performance, Thrones, Full Database of Previous Master Thesis in China, Engineering Technology I, 2015 01, B015-238, Jan. 15, 2015, in 2 pages.
(Continued)

*Primary Examiner* — Elizabeth E Mulvaney
(74) *Attorney, Agent, or Firm* — Knobbe, Martens, Olson & Bear, LLP

(57) ABSTRACT

Disclosed herein are embodiments of low temperature co-fireable dielectric materials which can be used in conjunction with high dielectric materials to form composite structures, in particular for isolators and circulators for radiofrequency components. Embodiments of the low temperature co-fireable dielectric materials can be scheelite or garnet structures, for example barium tungstate. Adhesives and/or glue is not necessary for the formation of the isolators and circulators.

20 Claims, 20 Drawing Sheets

Related U.S. Application Data continuation of application No. 16/123,327, filed on Sep. 6, 2018, now Pat. No. 11,081,770.

(60) Provisional application No. 62/555,811, filed on Sep. 8, 2017.

(51) Int. Cl.
| | |
|---|---|
| *C04B 35/26* | (2006.01) |
| *C04B 35/495* | (2006.01) |
| *C04B 37/00* | (2006.01) |
| *H01L 21/8258* | (2006.01) |
| *H01P 1/36* | (2006.01) |
| *H01P 1/38* | (2006.01) |
| *H01P 11/00* | (2006.01) |

(52) U.S. Cl.
CPC ........ *C04B 35/2675* (2013.01); *C04B 35/495* (2013.01); *C04B 37/001* (2013.01); *H01L 21/8258* (2013.01); *H01P 1/38* (2013.01); *H01P 11/003* (2013.01); *C04B 2235/3201* (2013.01); *C04B 2235/3203* (2013.01); *C04B 2235/3206* (2013.01); *C04B 2235/3215* (2013.01); *C04B 2235/3222* (2013.01); *C04B 2235/3224* (2013.01); *C04B 2235/3239* (2013.01); *C04B 2235/3256* (2013.01); *C04B 2235/3258* (2013.01); *C04B 2235/3275* (2013.01); *C04B 2235/3298* (2013.01); *C04B 2235/764* (2013.01); *C04B 2235/9607* (2013.01); *C04B 2237/34* (2013.01); *C04B 2237/84* (2013.01)

(56) References Cited

U.S. PATENT DOCUMENTS

| | | | |
|---|---|---|---|
| 4,122,418 | A | 10/1978 | Nagao |
| H470 | H | 5/1988 | Stern et al. |
| 5,051,869 | A | 9/1991 | Goldfarb |
| 5,058,265 | A | 10/1991 | Goldfarb |
| 5,096,878 | A | 3/1992 | Hoshino et al. |
| 5,896,563 | A | 4/1999 | Kawanami et al. |
| 5,959,059 | A | 9/1999 | Vedula et al. |
| 6,504,444 | B1 | 1/2003 | Furuya et al. |
| 6,611,180 | B1 | 8/2003 | Puzella et al. |
| 6,646,515 | B2 | 11/2003 | Jun et al. |
| 6,842,140 | B2 | 1/2005 | Killen et al. |
| 6,844,789 | B2 | 1/2005 | Lombardi et al. |
| 6,938,443 | B1 | 9/2005 | Fabian |
| 7,132,381 | B1 | 11/2006 | Oh et al. |
| 7,242,264 | B1 | 7/2007 | How |
| 7,256,661 | B2 | 8/2007 | Chen et al. |
| 7,368,998 | B2 | 5/2008 | Abe et al. |
| 7,681,069 | B1 | 3/2010 | Chellappa et al. |
| 7,687,014 | B2 | 3/2010 | Zheng et al. |
| 8,282,763 | B2 | 10/2012 | Cruickshank et al. |
| 8,514,031 | B2 | 8/2013 | Popelka et al. |
| 8,696,925 | B2 | 4/2014 | Cruickshank et al. |
| 8,891,596 | B2 | 11/2014 | Hayafuji et al. |
| 9,214,712 | B2 | 12/2015 | Cruickshank et al. |
| 9,263,175 | B2 | 2/2016 | Cruickshank et al. |
| 9,527,776 | B2 | 12/2016 | Cruickshank et al. |
| 9,640,849 | B2 | 5/2017 | Cruickshank et al. |
| 9,711,835 | B2 | 7/2017 | Cruickshank et al. |
| 9,771,304 | B2 | 9/2017 | Cruickshank et al. |
| 9,935,351 | B2 | 4/2018 | Cruickshank |
| 10,181,632 | B2 | 1/2019 | Cruickshank et al. |
| 10,370,299 | B2 | 8/2019 | Cruickshank et al. |
| 10,483,619 | B2 | 11/2019 | Hill et al. |
| 10,581,134 | B2 | 3/2020 | Cruickshank |
| 10,766,786 | B2 | 9/2020 | Chen et al. |
| 10,773,972 | B2 | 9/2020 | Cruickshank et al. |
| 10,860,432 | B2 | 12/2020 | Wolfe |
| 11,081,770 | B2 * | 8/2021 | Hill .......................... H01P 1/38 |
| 11,155,478 | B2 | 10/2021 | Greulich et al. |
| 11,373,788 | B2 | 6/2022 | Hill et al. |
| 11,387,532 | B2 | 7/2022 | Cruickshank et al. |
| 11,565,976 | B2 | 1/2023 | Hill et al. |
| 11,603,333 | B2 | 3/2023 | Hill et al. |
| 11,699,836 | B2 * | 7/2023 | Hill .......................... H01P 1/387 428/702 |
| 11,715,869 | B2 * | 8/2023 | Hill .......................... B32B 18/00 428/692.1 |
| 11,804,642 | B2 | 10/2023 | Cruickshank et al. |
| 11,936,088 | B2 | 3/2024 | Hill et al. |
| 11,958,778 | B2 | 4/2024 | Hill et al. |
| 2003/0126247 | A1 | 7/2003 | Strasser et al. |
| 2005/0034633 | A1 | 2/2005 | Lai |
| 2005/0040908 | A1 | 2/2005 | Mazzochette et al. |
| 2010/0279847 | A1 | 11/2010 | Shimada et al. |
| 2018/0166763 | A1 | 6/2018 | Cruickshank et al. |
| 2023/0242450 | A1 | 8/2023 | Hill et al. |
| 2023/0291085 | A1 | 9/2023 | Hill et al. |
| 2024/0128627 | A1 | 4/2024 | Cruickshank et al. |

FOREIGN PATENT DOCUMENTS

| | | |
|---|---|---|
| CN | 102249663 A | 11/2011 |
| CN | 102249664 A | 11/2011 |
| CN | 103121843 A | 3/2013 |
| CN | 103011810 A | 4/2013 |
| CN | 103172376 A | 6/2013 |
| CN | 104380526 A | 2/2015 |
| CN | 105304991 A | 2/2016 |
| CN | 103715487 B | 3/2016 |
| CN | 106242547 A | 12/2016 |
| CN | 109467427 A | 3/2019 |
| CN | 110615478 A | 12/2019 |
| DE | 10 2019 208 855 A1 | 12/2019 |
| EP | 2 978 067 A1 | 1/2016 |
| EP | 3 453 682 A1 | 3/2019 |
| GB | 2235339 A | 2/1991 |
| GB | 2576092 A | 2/2020 |
| IN | 8301DELNP2007 A | 4/2006 |
| JP | H06-112028 A | 4/1994 |
| JP | H07-312509 A | 11/1995 |
| JP | H08-078284 A | 3/1996 |
| JP | H11-145577 A | 5/1999 |
| JP | 2001-028504 A | 1/2001 |
| JP | 2004-149382 | 5/2004 |
| JP | 2007-051050 | 3/2007 |
| JP | 2009-088089 A | 4/2009 |
| JP | 2011-515998 A | 5/2011 |
| JP | 2019-048764 A | 3/2019 |
| JP | 2020-002004 A | 1/2020 |
| KR | 10-2007-0021015 A | 2/2007 |
| KR | 10-0698440 B1 | 3/2007 |
| KR | 10-2019-0142736 A | 12/2019 |
| SG | 10201905557 R | 1/2020 |
| TW | 201828529 A | 8/2018 |
| TW | 201922675 A | 6/2019 |
| TW | 201945323 A | 12/2019 |
| TW | 202000456 A | 1/2020 |
| WO | WO 2009/120667 A2 | 10/2009 |
| WO | WO 2010/047723 A1 | 4/2010 |
| WO | WO 2011/075123 A1 | 6/2011 |
| WO | WO 2012/082642 A2 | 6/2012 |
| WO | WO 2012/170259 A2 | 12/2012 |
| WO | WO 2013/173639 A2 | 11/2013 |
| WO | WO 2018/089853 A1 | 5/2018 |
| WO | WO 2019/209614 A1 | 10/2019 |

OTHER PUBLICATIONS

Pang, L. et al., "Microwave Dielectric Properties of (Li0.5Ln0.5)MoO4 (Ln=Nd, Er, Gd, Y, Yb, Sm, and Ce) Ceramics", Journal of the American Ceramic Society, Sep. 2014, vol. 98(1), pp. 130-135.

(56) References Cited

OTHER PUBLICATIONS

Zaspalis, V.T. et al., "Materials for inductive and microwave function integration in LTCC-technology multichip modules", Journal of Physics: Conference Series, vol. 10, 2005, pp. 357-360.
Zhou, D. et al., "Phase evolution and microwave dielectric properties of $(Li_{0.5}Bi_{0.5})(W_{1-x}Mo_x)O4$ ($0.0 \leq x \leq 1.0$) ceramics with ultra-low sintering temperatures", Functional Materials Letters, Dec. 2012, vol. 5(4), pp. 1250042-1-1250042-5.
Zhou, H., et al., "Sintering characteristic, crystal structure and microwave dielectric properties of a novel thermally stable ultra-low-firing $Na_2BiM_g2V_3O_{12}$ ceramic", Journal of Materials Science: Materials in Electronics, Apr. 2014, vol. 25, pp. 2470-2474.
Chinese Office Action for Chinese Application No. 201811045092. X, dated Nov. 15, 2021.
Chinese Office Action for Chinese Application No. 201811045092. X, dated Apr. 28, 2022.
European Office Action for European Application No. 18192941.5, dated Dec. 3, 2018.
European Office Action for European Application No. 18192941.5, dated Mar. 19, 2020.
European Office Action for European Application No. 18192941.5, dated Apr. 30, 2021.
International Search Report and Written Opinion for International Application No. PCT/US2017/061184, dated Apr. 10, 2018.
International Preliminary Report on Patentability for International Application No. PCT/US2017/061184 dated May 14, 2019.
International Search Report and Written Opinion for International Application No. PCT/US2019/028055, dated Aug. 9, 2019.
International Preliminary Report on Patentability for International Application No. PCT/US2019/028055 dated Nov. 5, 2020.
International Search Report and Written Opinion for International Application No. PCT/US2019/038180, dated Oct. 4, 2019.
Japanese Office Action for Japanese Application No. 2018-167099, dated Nov. 16, 2021.
Decision to Grant for Japanese Application No. 2018-167099, dated Jun. 28, 2022.
Decision to Grant for Japanese Application No. 2022-120450, dated Sep. 26, 2023.
Taiwanese Office Action for Taiwanese Application No. 106139371, dated Mar. 31, 2021.
Taiwanese Office Action for Taiwanese Application No. 106139371, dated Oct. 25, 2021.
Taiwanese Office Action for Taiwanese Application No. 106139371, dated Jun. 24, 2022.
Taiwanese Office Action for Taiwanese Application No. 106139371, dated May 17, 2023.
Taiwanese Office Action for Taiwanese Application No. 106139371, dated Nov. 6, 2023.
Taiwanese Office Action for Taiwanese Application No. 107131408, dated Dec. 7, 2021.
United Kingdom Office Action for United Kingdom Application No. 2019933.7, dated Jul. 18, 2022.

\* cited by examiner

LOW TEMPERATURE CO-FIREABLE DIELECTRIC MATERIALS

INCORPORATION BY REFERENCE TO ANY PRIORITY APPLICATIONS

This Application is a continuation of U.S. patent application Ser. No. 17/364,325, filed Jun. 30, 2021, which is a continuation of U.S. patent application Ser. No. 16/123,327, filed Sep. 6, 2018, which claims from the benefit of U.S. Provisional Application No. 62/555,811, filed Sep. 8, 2017, titled "LOW TEMPERATURE CO-FIREABLE DIELECTRIC MATERIALS," the entirety of which is incorporated herein by reference.

BACKGROUND

Field

Embodiments of the disclosure relate to co-fireable dielectric materials that can be formed without the use of adhesives.

Description of the Related Art

Circulators and isolators are passive electronic devices that are used in high-frequency (e.g., microwave) radio frequency systems to permit a signal to pass in one direction while providing high isolation to reflected energy in the reverse direction. Circulators and isolators commonly include a disc-shaped assembly comprising a disc-shaped ferrite or other ferromagnetic ceramic element, disposed concentrically within an annular dielectric element.

A conventional process for making the above-referenced composite disc assemblies is illustrated by the flow diagram of FIG. 1. At step 12, a cylinder is formed from a dielectric ceramic material. At step 14, the (unfired or "green") cylinder is then fired in a kiln (commonly referred to simply as "firing"). Thus, the ceramic material is "fireable". At step 16, the outside surface of the cylinder is then machined to ensure its outside diameter (OD) is of a selected dimension. Achieving precise dimensions in the assembly elements is important because the dimensions affect microwave waveguide characteristics. At step 18, the inside surface of the cylinder is similarly machined to ensure its inside diameter (ID) is of a selected dimension. In addition, at step 20, a rod is formed from a magnetic ceramic material. At step 22, the rod is then fired, and at step 24 its surface is machined to a selected OD. The rod OD is slightly less than the cylinder ID so that the rod can be fitted securely within the cylinder, as described below. Achieving a close fit that promotes good adhesion between the rod and cylinder is a reason that both the outside surface of the rod and the inside surface of the cylinder are machined to precise tolerances.

Importantly, at step 26 epoxy adhesive is applied to the one or both of the rod and cylinder. At step 28, the rod is inserted inside the cylinder to form a rod-and-cylinder assembly, and the epoxy is allowed to cure (harden), as indicated by step 30. At step 32, the outside surface of the rod-and-cylinder assembly is again machined to a precise OD. Lastly, at step 34, the rod-and-cylinder assembly is sliced into a number of disc assemblies. Each disc assembly thus comprises a magnetic ceramic disc disposed concentrically within a dielectric ceramic ring. Each disc assembly is typically several millimeters in thickness.

The time involved in machining the inside surface of the cylinder to promote adhesion, applying epoxy to the parts, carefully handling and assembling the epoxy-laden parts, and curing the epoxy, contributes to inefficiency in the process. It would be desirable to provide a more efficient method for making composite magnetic-dielectric disc assemblies.

SUMMARY

Disclosed herein are embodiments of a composite material for use as a radiofrequency component comprising a low temperature fireable outer material, the low temperature fireable outer material having a garnet or scheelite structure, and a high dielectric inner material located within the outer material, the high dielectric inner material having a dielectric constant above 30, wherein the low temperature fireable outer material and the high dielectric inner material are configured to be co-fired together at temperature between 650-900° C. without the use of adhesive or glue.

In some embodiments, the low temperature fireable outer material can be shaped like a ring. In some embodiments, the high dielectric inner material can be shaped like a disc.

In some embodiments, the low temperature fireable outer material can be $Na_{0.2}Bi_{0.8}Mo_{0.4}V_{0.6}O_4$ or $Na_{0.35}Bi_{0.65}Mo_{0.7}V_{0.3}O_4$.

In some embodiments, the low temperature fireable outer material can have the composition $Bi_{1-2x}A_{2x}V_{1-x}M_xO_4$, A being Li, Na, K, or combinations thereof, M being Mo, W, or combinations thereof, and x being between 0 and 0.45. In some embodiments, the low temperature fireable outer material can have a dielectric constant between 20 and 80. In some embodiments, the low temperature fireable outer material can have the composition $C_2BiD_2V_3O_{12}$, C being Li, Na, K, or combinations thereof, and D being Mg, Zn, Co, Ni, Cu, or combinations thereof. In some embodiments, the low temperature fireable outer material can be barium tungstate having the chemical formula $BaWO_4$.

In some embodiments, the barium tungstate can be modified with $MgAl_2O_4$ or $CoAl_2O_4$. In some embodiments, the low temperature fireable outer material can be $Na_2BiMg_2V_3O_{12}$. In some embodiments, the high dielectric inner material can have a dielectric constant above 35.

Also disclosed herein are embodiments of a method of forming a composite material for use as an isolator or circulator in a radiofrequency device, the method comprising providing a low temperature fireable outer material, the low fireable outer material having a garnet or scheelite structure, entering a high dielectric inner material within an aperture in the low temperature fireable outer material, the high dielectric inner material having a dielectric constant above 30, and co-firing the lower temperature fireable outer material and the high dielectric inner material together at temperature between 650-900° C. to shrink the low temperature fireable outer material around an outer surface of the high dielectric inner material without the use of adhesive or glue.

In some embodiments, the low temperature fireable outer material can have the composition $Bi_{1-2x}A_{2x}V_{1-x}M_xO_4$, A being Li, Na, K, or combinations thereof, M being Mo, W, or combinations thereof, and x being between 0 and 0.45. In some embodiments, the low temperature fireable outer material can have the composition $C_2BiD_2V_3O_{12}$, C being Li, Na, K, or combinations thereof and D being Mg, Zn, Co, Ni, Cu, or combinations thereof. In some embodiments, the low temperature fireable outer material can be barium tungstate having the chemical formula $BaWO_4$. In some embodiments, the low temperature fireable outer material can be $Na_2BiMg_2V_3O_{12}$.

In some embodiments, the method can further include slicing the lower temperature fireable outer material and the high dielectric inner material after co-firing.

Further disclosed herein are embodiments of a radiofrequency isolator or circulator comprising a low temperature fireable outer material, the low temperature fireable outer material having a garnet or scheelite structure, and a high dielectric inner material located within the outer material, the high dielectric inner material having a dielectric constant above 30, wherein the low temperature fireable outer material and the high dielectric inner material are configured to be co-fired together at temperature between 650-900° C. without the use of adhesive or glue.

In some embodiments, the low temperature fireable outer material can have the composition $Bi_{1-2x}A_{2x}V_{1-x}M_xO_4$, A being Li, Na, K, or combinations thereof, M being Mo, W, or combinations thereof, and x being between 0 and 0.45. In some embodiments, the low temperature fireable outer material can have the composition $C_2BiD_2V_3O_{12}$, C being Li, Na, K, or combinations thereof and D being Mg, Zn, Co, Ni, Cu, or combinations thereof. In some embodiments, the low temperature fireable outer material can be barium tungstate having the chemical formula $BaWO_4$.

DETAILED DESCRIPTION

Disclosed herein are embodiments of low firing dielectric materials. These materials can be co-fired with high dielectric materials to form composites for magnetic-dielectric assemblies, such as for isolator and circulator applications. Advantageously, embodiments of the disclosed materials can be co-fired without needing any adhesives, such as glue, epoxy or other chemical adhesives. Thus, composites formed out of embodiments of the disclosure can be glue free, epoxy free, chemically attachment free, or adhesive free. Thus, in some embodiments no glue, no epoxy, and no adhesive is used when forming the composite assembly.

Embodiments of the disclosure could advantageously allow for 5G systems, in particular operating at 3 GHz and above, to form integrated architectures which can include different components, such as antennas, circulators, amplifiers, and/or semiconductor based amplifiers. By allowing for the integration of these components onto a single substrate, this can improve the overall miniaturization of the device. In some embodiments, the disclosed devices can be operable at frequencies between about 1.8 GHz and about 30 GHz. In some embodiments, the disclosed device can be operable at frequencies of greater than about 1, 2, 3, 4, 5, 10, 15, 20, or 25 GHz. In some embodiments, the disclosed device can be operable at frequencies of less than 30, 25, 20, 15, 10, 5, 4, 3, or 2 GHz.

Figure 1:
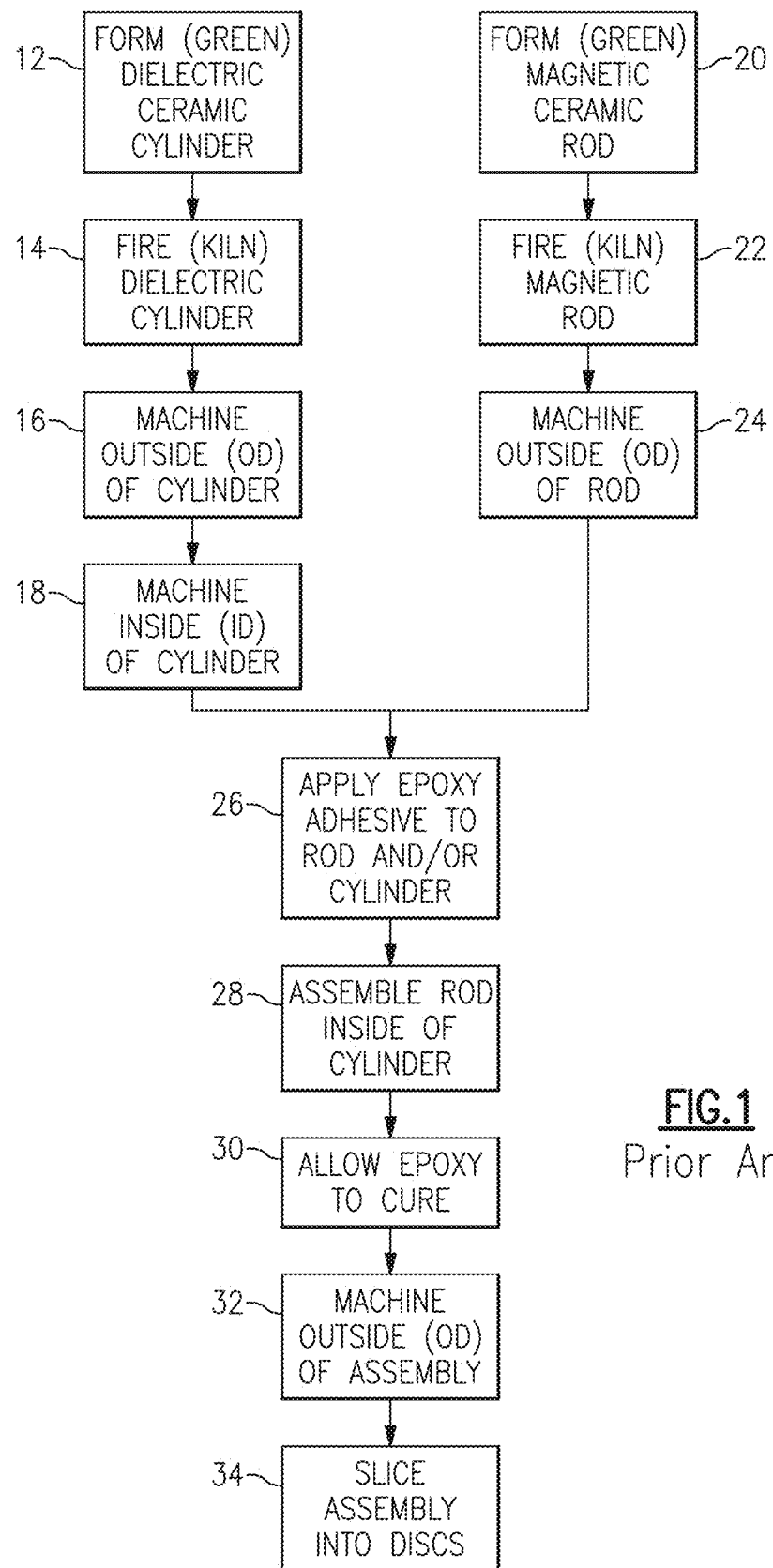
FIG. 1 illustrates a flow diagram of a method for fabricating composite magnetic-dielectric disc assemblies in accordance with the prior art.
Figure 2:
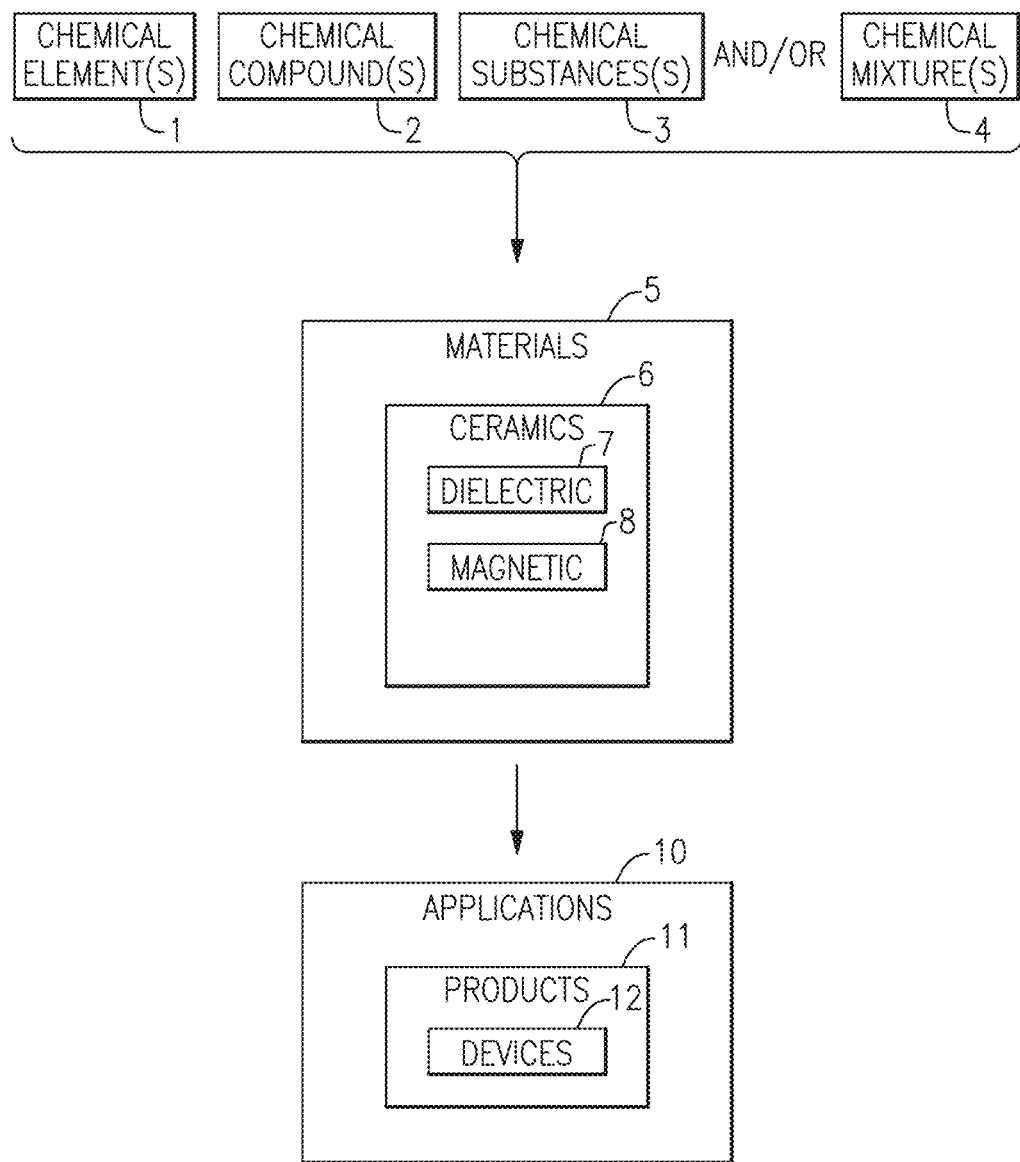
FIG. 2 schematically shows how materials having one or more features described herein can be designed, fabricated, and used.

In some embodiments, the integrated architecture can include a directional coupler and/or isolator in a package size which is not much larger than a standard isolator. In some embodiments, the integrated architecture can include a high power switch. In addition to using the dielectric tile as the substrate for the impedance transformer, it could also be used as the substrate for the coupler, switch and termination FIG. 2 schematically shows how one or more chemical elements (block 1), chemical compounds (block 2), chemical substances (block 3) and/or chemical mixtures (block 4) can be processed to yield one or more materials (block 5) having one or more features described herein. In some embodiments, such materials can be formed into ceramic materials (block 6) configured to include a desirable dielectric property (block 7), a magnetic property (block 8).

In some embodiments, a material having one or more of the foregoing properties can be implemented in applications (block 10) such as radio-frequency (RF) application. Such applications can include implementations of one or more features as described herein in devices 12. In some applications, such devices can further be implemented in products 11. Examples of such devices and/or products are described herein.

Microstrip Circulators/Isolators

Circulators are passive multiport devices which can receive and transmit different signals, such as microwave or radiofrequency (RF). These ports can be an external waveguide or transmission line which connects to and from the circulator. Isolators are similar to circulators, but one or more of the ports can be blocked off. Hence, circulator and isolator can be used interchangeably herein as they can be similar in general structural. Thus, all discussion below can apply both to circulators and isolators.

Microstrip circulators and isolators are devices known in the art consist of a thin film circuit deposited over a substrate, such as a dielectric ferrite substrate. In some embodiments, one or more ferrite discs can be adhered onto the substrate. Magnet(s) can then be further attached to circulate a signal through the ferrite disc.

Further, all-ferrite microstrip circulators have been used as well, in particular for radar T/R modules. Circuitry can be printed onto the all ferrite microstrip circulator and a magnet can be added on top to direct the signal. For example, a metallization pattern is formed onto a ferrite substrate. Typically, the metallization pattern consists of a central disc and multiple transmission lines.

Figure 3:
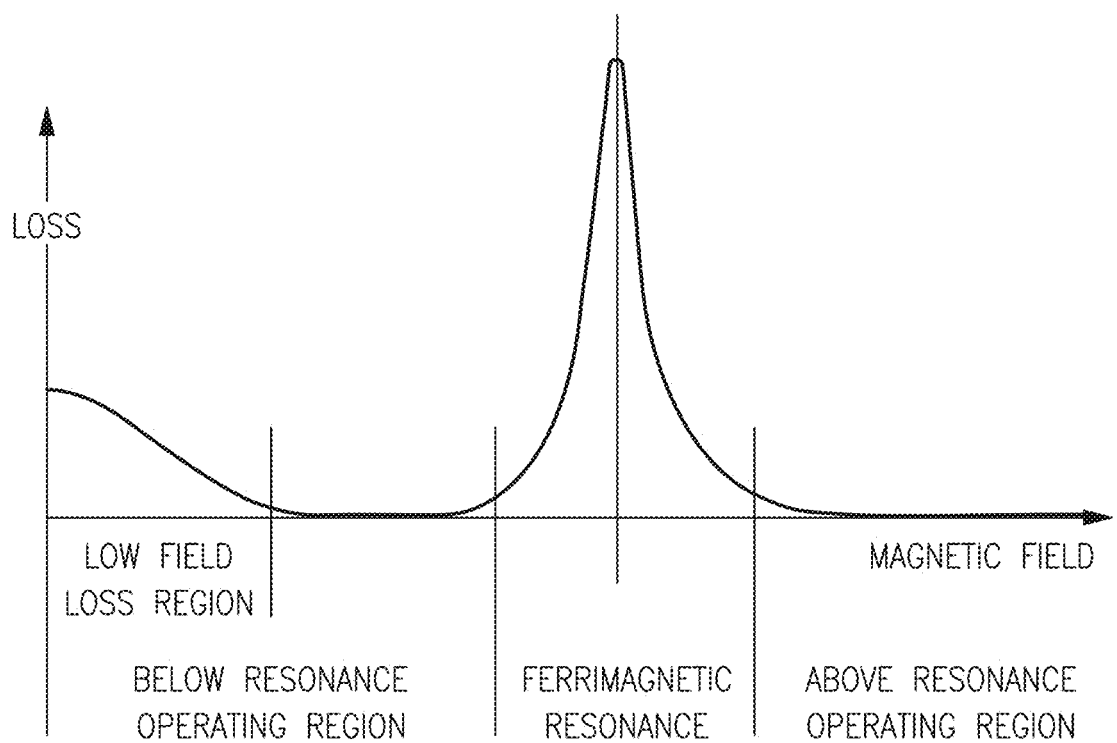
FIG. 3 illustrates a magnetic field v. loss chart.

Circulators generally can operate in either of the above or below resonance operating regions. This is shown in FIG. 3. In some embodiments, above-resonance frequencies can be advantageous for narrow band, sub 4 GHz circulators. For higher frequencies, the below resonance region can be more advantageous.

Microstrip circulators in particular typically work in the below resonance operating region. They use a very small magnet or can be self-biased, such as in the case of hexagonal ferrites. However, square tiles can be a difficult shape to magnetize uniformly, in particular for the all-ferrite microstrip circulators known in the art. Thus, they will operate close to the low field loss region. When transformers are mounted on the lossy unmagnetized ferrite, performance suffers. Further, increased power will make the poor performance even more known. Thus, circulators known in the art suffer from issues due to the ferrite tile being poorly magnetized, leading to poor insertion loss and intermodulation distortion (IMD), and power performance.

Co-Fired Microstrip Circulators/Isolators

Embodiments of the disclosure can improve overall magnetization and reduce performance issues that can occur for currently known microstrip circulators. Generally, the microstrip circulators can be formed by embedding a ferrite disc, such as an oxide ferrite disc made of yttrium iron garnet (YIG), directly into a dielectric substrate. The combination can then be co-fired to form a more solid composite structure. Additional circuitry, such as formed from silver or other metalized substances, can be added. Without the co-firing process, circuit metallization would not be able to be applied. Embodiments of this disclosure can alleviate some of the significant problems of the art.

Any number of different ferrite disc materials that can be used. In some embodiments, the saturation magnetization levels of the ferrite disc material can range between 1000-5000 (or about 1000-about 5000) gauss.

Further, any number of different dielectric substrates known in the art can be used. Further, the dielectric can be formed form dielectric powder or low temperature co-fired ceramic (LTCC) tape. In some embodiments, the dielectric constant can be above 6, 10, 15, 20, 25, 30, 40, 50, or 60. In some embodiments, the dielectric constant can range from 6-30 (or about 6 to about 30). In some embodiments, the dielectric constant can be below about 60, 50, 40, 30, 25, 20, 15, or 10.

Figure 4A:
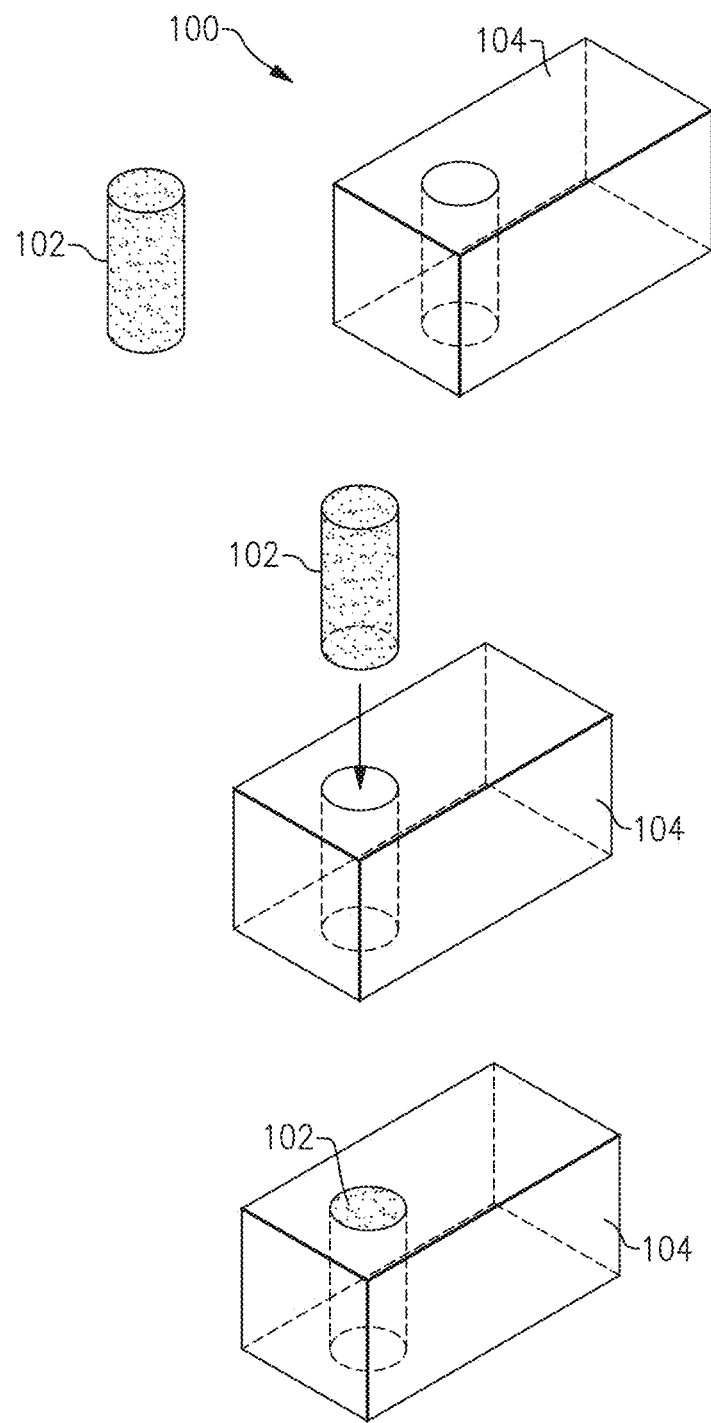
FIGS. 4A-B illustrate an embodiment of a composite structure having a ferrite cylinder within a rectangular prism or cylindrical substrate.
Figure 4B:
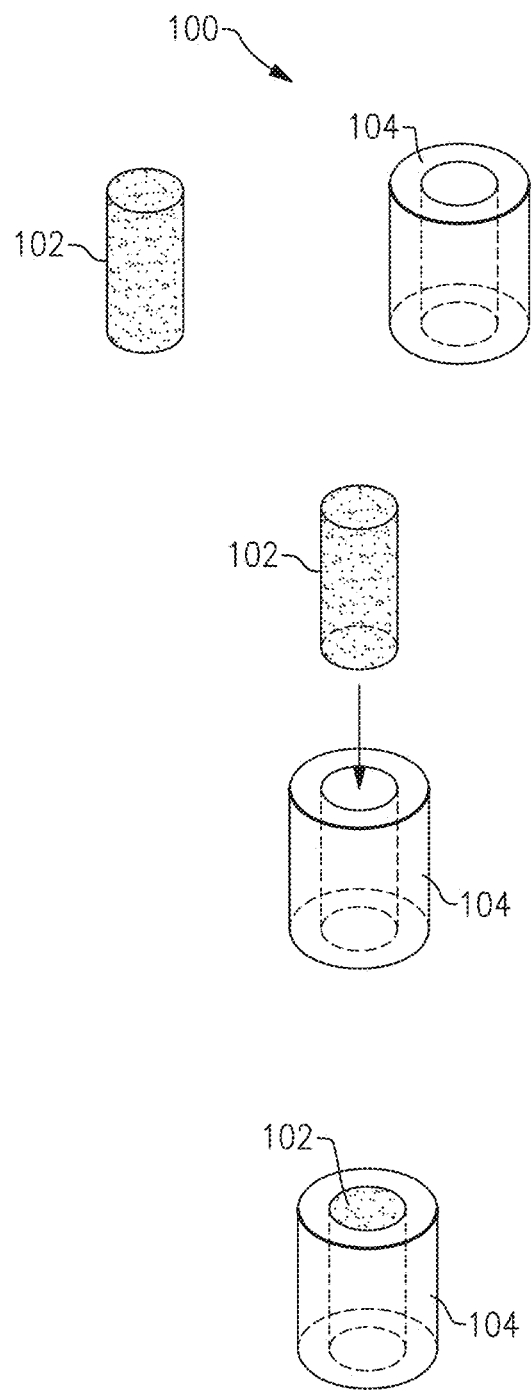

In particular, to form the composite microstrip circulator 100, a magnetic oxide disc 102, or other magnetic disc, can be inserted into an aperture of a dielectric substrate 104 as shown in FIGS. 4A-B. In some embodiments, the disc 102 can be a cylindrical rod, though the particular shape is not limiting. The disc 102 can be green, previously fired, or not-previously fired.

Figures 5A, 5B:
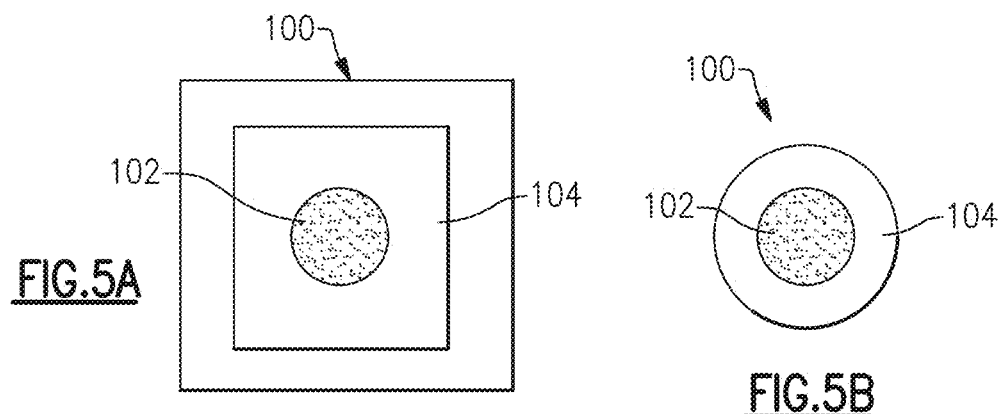
FIGS. 5A-B illustrate an embodiment of a composite tile with a square or circle shape.

Further, the substrate 104 can generally be a rectangular prism as shown in FIG. 4A, but other shapes can be used as well such as the cylinder shown in FIG. 4B. Embodiments of the substrate 104 are disclosed in more detail below. Once the disc 102 is inside the substrate 104, the components can be fired together (e.g., co-fired), using such a method as discussed in U.S. Pat. Nos. 7,687,014 or 8,282,763, hereby incorporated by reference in their entirety and discussed below. This co-firing process, further detailed below, can cause the substrate 104 to shrink around the disc 102 and hold it in place in conjunction with adhesives to form the composite structure 100. This composite structure 100 can then be sliced to form the chip structure as shown in FIGS. 5A-B (FIG. 5A showing the rectangular prism slice and FIG. 5B showing the cylinder slice). However, in some embodiments, slicing is not performed and the components are co-fired together at their final thickness. In some embodiments, a plurality of different discs can be inserted into a single substrate in a plurality of different apertures.

Thus, in some embodiments a magnetic oxide disk can be co-fired into a square or rectangular dielectric substrate, or any other shaped substrate, which can then serve as a platform for other components, such as circuitry. This composite structure can then be magnetized to serve as a microstrip circulator and/or isolator package, for example, or the ferrite disc could have been magnetized prior to insertion. In some embodiments, the ferrite disc can be magnetized prior to the co-firing step.

Once the composite structure is formed, other components can be added onto the substrate, such as additional thin film circuits and the like. Thus, embodiments of the disclosure can form an integrated solution which can include a directional coupler and/or isolator in a package size which is not much larger than a standard isolator. Further, advantageously loss may not be affected by the level of magnetic field, or can at least be reduced. In some embodiments, the disclosed circulator will be no larger (and depending on the ferrite/dielectric combination chosen could be smaller) than all current ferrite microstrip circulators.

Thus, using a co-firing process, a ferrite disc can be embedded into a dielectric tile, as shown in FIGS. 5A-B. The thin ferrite disc shown in the figure can be significantly easier to magnetize uniformly than a square, or other oddly shaped piece, known in the art. In some embodiments, the dielectric tile could be about 25 mm square though the particular dimensions are not limiting. This can be used in the 3-4 (or about 3-about 4) GHz region.

Figure 6:
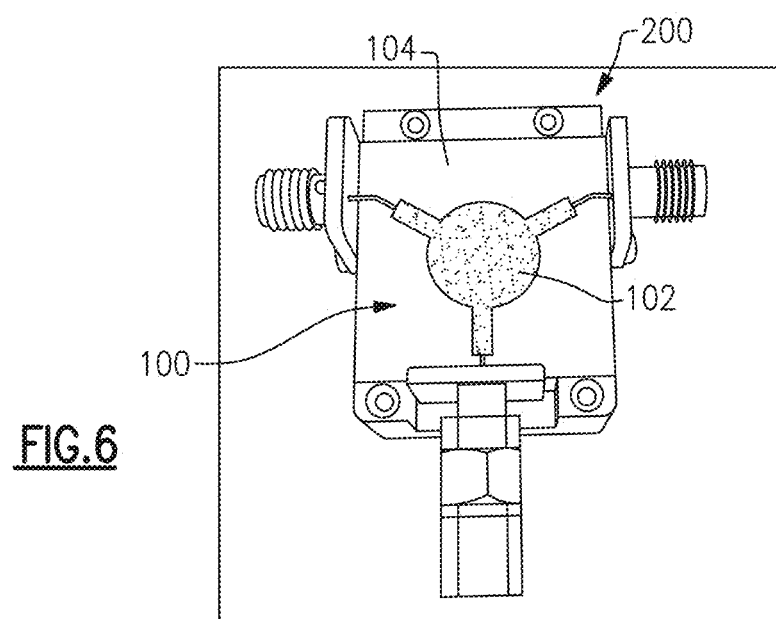
FIG. 6 illustrates an integrated microstrip circulator without a magnet.
Figure 7:
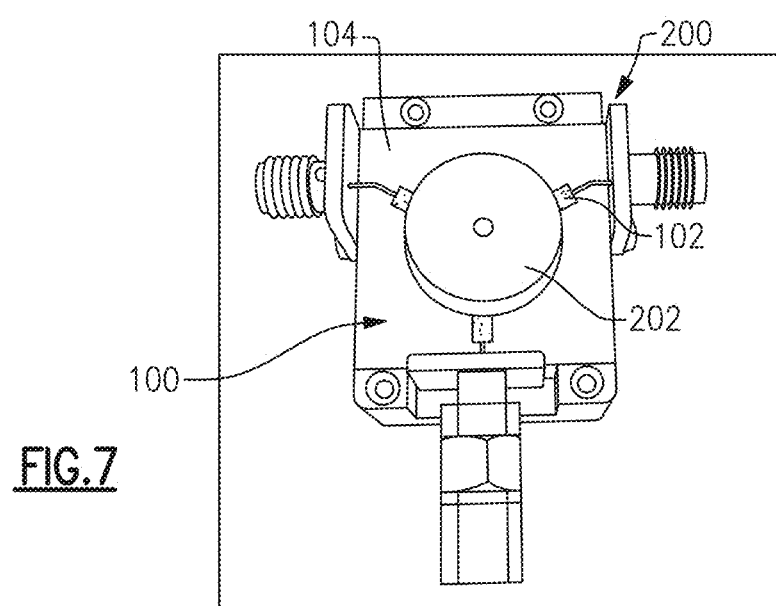
FIG. 7 illustrates an integrated microstrip circulator with a magnet.

Using the dielectric tile, a transformer can then be produced as shown in FIG. 6. As shown, the substrate 104 has space left over for other component attachments. After forming the transformer, only a small magnet needs to be placed on the tile, as shown in FIG. 7. Thus, assembly time can be much shorter than previously done.

In addition to using the dielectric tile as the substrate for the impedance transformer, it could also be used as the substrate for the coupler, switch, and termination. Thus, a number of other components can be added onto the substrate after co-firing, reducing the overall footprint of the device. Further, circuit metallization could be added, but only after the device has been co-fired.

Low Temperature Firing Dielectric Materials for Rings

Embodiments of the disclosure can be particularly advantageous for a co-firing process with a magnetic material, such as for the formation of circulators/isolators for radiofrequency components such as antennas. In particular, the magnetic materials can be high dielectric magnetic materials with low firing temperatures (e.g., they can be fireable at a low temperature).

Specifically, a rod (or other shape, such as a disc or square) of magnetic material can be inserted into an unfired ring formed from embodiments of the disclosed low temperature firing dielectric materials, such as shown in FIGS. 4A-B above (104 being the ring and 102 being the rod). The combination of the ring and the rod can then be co-fired together so that the ring shrinks around the rod. Both of these materials can be "fireable", meaning they have the ability to be fired or sintered in an oven/kiln/other heating device. In some embodiments, firing can change one or more properties of the material, such as the ceramic materials discussed herein. Thus, it can be advantageous to have the ring material and the rod material have generally similar firing temperatures in order to avoid negatively affecting either of their physical properties. Embodiments of these assemblies can be used as isolators and/or circulators for radiofrequency applications, such as for 5G applications.

Advantageously, this co-firing process can be performed without the use of adhesives/epoxies/glues and thus can be considered a "glueless assembly" or "adhesiveless assembly". Previous iterations of the assembly fire the fireable ring separate from the fireable rod due to the temperature for firing the ring being too high, which can lead to melting, or at least considerably damaging the properties of the internal rod. For the prior methods, both segments can be fired separately, or the ring can be fired first and then the ring/rod assembly is fired together. For each of these approaches, the ring will not sufficiently shrink around the rod and thus an adhesive, or other chemical attachment means, will be needed to keep the ring and the rod attached to one another. Thus, embodiments of the disclosure can be a ring material that is shrunk around a magnetic rod without the use of any adhesives. It is the mechanical constrainment of the shrinking ring around the rod (such as frictional forces) which keeps the rod in place within the ring.

It can be advantageous to use the disclosed adhesive-less assemblies as the use of adhesives has a number of drawbacks. Advantageously the disclosed material can form a composite structure without the need for such adhesive as the rod and ring can be co-fired together. For example, it is extremely difficult, if not impossible, to metallize the assembly once there is adhesive. This is because the temperature required for metallization is much higher than the use temperature for the adhesive, causing the adhesive to melt and/or lose adhesive. Further, the adhesive is lossy, increasing the insertion loss of glued components. The dielectric loss of the glue/adhesive at high frequencies is greater than the magnetic or the dielectric material. Thus, advantageously the disclosed assemblies do not require the use of adhesives.

The following materials can be used as the magnetic rod held within the ring. Specifically, embodiments of the ring material can have low dielectric constants (<10) suitable for co-firing with rods of high magnetization spinels (for example nickel zinc ferrites) such as disclosed in U.S. Pat. Pub. No. 2017/0098885, hereby incorporated by reference in its entirety, in particular for high frequency (5G) applications. This can include materials such as $Ni_{1-w-x-y-z}Zn_wCo_xMn_yCu_zFe_2O_4$ where w ranges from 0.2 to 0.6, and x, y, and z each range from 0 to 0.2, and a ranges from 0 to 0.2. In a preferred implementation, w=0.4725, x=0.0225, y=0.02, z=0, and a=0.08. In another preferred implementation, w=0.4, x=0.0275, y=0.01, z=0, and a=0.08. In one implementation, the rod material can be represented by the formula $Ni_{1-x-y}Zn_xCo_yFe_2O_4$, where x=0.2 to 0.6, and 0≤y<0.2.

Further, the following material can also be used as the magnetic rod held within the ring. Thus, embodiments of the disclosed low firing dielectric ring material can have a scheelite or garnet structure which can be co-fired with high dielectric constant rod materials such as disclosed in U.S. Pat. Pub. No. 2018/0016155, the entirety of which is hereby incorporated by reference in its entirety. The high dielectric constant magnetic rod can be a bismuth substituted high dielectric constant magnetic garnet. Other materials, such as disclosed in U.S. patent application Ser. No. 15/972,617, titled "INDIUM CONTAINING MAGNETIC GARNET MATERIALS" and filed May 7, 2018, can be used as well and the entirety of the disclosure is incorporated by reference. Example garnets include: $Y_{3-x-y}Bi_xCa_yZr_yFe_{5-y}O_{12}$. In some embodiments, 0<x<1.8 and 0<y<1.0. In some embodiments, the modified synthetic garnet composition can be defined by the general composition: $Y_{3-x-y-2a}Bi_xCa_{y+2a}Zr_yIn_zV_aFe_{5-y-z-a}O_{12}$. In some embodiments, 0<x<1.8, 0<y<1.0, 0≤z≤1.0, and 0≤a≤1.0.

The examples given above regarding the magnetic rod material are merely examples and other materials can be used as well. In some embodiments, the magnetic rod material (e.g., the high dielectric inner material) can have a dielectric constant about 20, 30, 35, 40, or 50. In some embodiments, the magnetic rod material can have a dielectric constant below 60, 50, or 40.

As discussed above, it can be advantageous to use an outer ring material which can be compatible (e.g., firing/sintering temperature compatible) with a high magnetic rod material, such as the magnetic rod materials discussed above, in order to avoid the use of chemical adhesives.

In some embodiments, the fireable ring material (e.g., the low temperature firing dielectric material) can be based on bismuth vanadate, which has the chemical formula $BiVO_4$. For example, embodiments of the material can have the general formula $Bi_{1-2x}A_{2x}V_{1-x}M_xO_4$. In some embodiments, x can be between 0 and 0.45 (or between about 0 and about 0.45). In some embodiments, 0<x<0.45. In some embodiments, x can equal 0.45. A can be Li, Na, K, or combinations thereof. M can be Mo, W, or combinations thereof.

This ring material can have a sintering temperature (e.g., firing temperature) of below 900° C., in particular 650-800° C. In some embodiments, the material can have a sintering temperature of below 850° C. In some embodiments, the material can have a sintering temperature of below 900, 850, 800, or 750° C. (or below about 900, about 850, about 800, or about 750° C.). In some embodiments, the material can have a sintering temperature above 500, 550, 600, 650, or 700° C. (or above about 500, about 550, about 600, about 650, or about 750° C.).

Further, embodiments of the ring material can have a dielectric constant range of between 20 and 80 (or about 20 and about 80) or between 20 and 70 (or about 20 and about 70). In some embodiments, the material can have a dielectric constant of above 10, 20, 30, 40, 50, 60 or 70 (or above about 10, 20, 30, 40, 50, 60, or 70). In some embodiments, the material can have a dielectric constant of below 80, 70, 60, 50, 40, 30, or 20 (or below about 80, 70, 60, 50, 40, 30, or 20).

In alternate embodiments, the ring material can have the composition: $C_2BiD_2V_3O_{12}$. C can be Li, Na, K, or combinations thereof. D can be Mg, Zn, Co, Ni, Cu, or combinations thereof. This composition can have a garnet structure.

This ring material can have a sintering temperature of below 900° C., in particular 650-800° C. In some embodiments, the material can have a sintering temperature of below 850° C. In some embodiments, the material can have a sintering temperature of below 900, 850, 800, or 750° C. (or below about 900, about 850, about 800, or about 750° C.). In some embodiments, the material can have a sintering temperature above 500, 550, 600, 650, or 700° C. (or above about 500, about 550, about 600, about 650, or about 750° C.).

Further, embodiments of the ring material can have a dielectric constant range of between 10 and 30 (or about 10 and about 30). In some embodiments, the material can have a dielectric constant of above 10, 15, 20, 25 or 30 (or above about 10, 15, 20, 25 or 30). In some embodiments, the material can have a dielectric constant of below 30, 25, 20, 15, or 10 (or below about 30, 25, 20, 15, or 10).

In alternate embodiments, the ring material can be $Na_2BiMg_2V_3O_{12}$. This material can have a dielectric constant of 25 (or about 25).

This material can have a sintering temperature of below 900° C., in particular 650-800° C. In some embodiments, the material can have a sintering temperature of below 850° C. In some embodiments, the material can have a sintering temperature of below 900, 850, 800, or 750° C. (or below about 900, about 850, about 800, or about 750° C.). In some embodiments, the material can have a sintering temperature above 500, 550, 600, 650, or 700° C. (or above about 500, about 550, about 600, about 650, or about 750° C.).

In some embodiments, binder can be blended into the above disclosed ring material compositions. For example, binder can be polyvinyl alcohol (PVA) or poly ethylene glycol (PEG), alone or in combination. However, the type of binder is not limiting. For example, the binder can be introduced as 2% level of the total composition.

Table I below provides the firing temperature and dielectric constant for a number of materials which can advantageously be used as an outer ring material. Thus, in some embodiments, the outer ring material may have a scheelite structure.

TABLE I

Materials Having Scheelite Structure

| Scheelite | Dielectric Constant | Firing Temperature (° C.) |
|---|---|---|
| $Na_{0.2}Bi_{0.8}Mo_{0.4}V_{0.6}O_4$ | 57 | 675 |
| $Li_{0.05}Bi_{0.95}Mo_{0.1}V_{0.9}O_4$ | 70 | 675 |
| $Li_{0.5}Bi_{0.5}Mo_{0.4}W_{0.6}O_4$ | 30 | 600 |
| $Li_{0.5}Sm_{0.5}MoO_4$ | 25 | 640 |

In some embodiments, barium tungstate can be used as the low temperature firing dielectric material for the outer ring. The barium tungstate can have the formula $BaWO_4$ and can form a scheelite structure. Further, a solid solution with barium tungstate as a main component can be used. This in particular can be used as a low dielectric constant co-fireable material to fire with high magnetization spinels, such as lithium ferrite or nickel zinc ferrite, such as discussed above. It can be advantageous to use this material to avoid moding, and to offset the impedance effect of thinner substrates also necessary at high frequencies.

This can be particularly useful for high frequency microstrip or surface integrated waveguide designs.

In some embodiments, the barium tungstate can be modified with $MgAl_2O_4$ or $CoAl_2O_4$ to modify the thermal expansion of the ferrite. However, this modification can be done with any of the ring materials discussed above as well. For example, these compositions can be mixed in prior to sintering the outer ring material as discussed above. It can be advantageous for the thermal expansion of the ferrite outer ring to match closely with the dielectric magnetic rod.

Table II below illustrates examples of materials advantageous as an outer-ring material, and their particular properties.

TABLE II

Table of Co-Fired Compositions

| Material | Dielectric Constant | Firing Temperature (° C.) | Soak (hr) | Green Density (g/cc) | Fired Density (g/cc) | ε' | Q | Testing (Fo) (MHz) Frequency of | OD Shrinkage | Length Shrinkage |
|---|---|---|---|---|---|---|---|---|---|---|
| $Na_{0.2}Bi_{0.8}MO_{0.4}V_{0.6}O_4$ | 57 | 725 | 4 | | 6.158 | 56.33 | 1176 | 3535.1 | 7.38% | 7.09% |
| $Li_{0.05}Bi_{0.95}MO_{0.1}V_{0.9}O_4$ | 70 | 750 | 4 | | 6.454 | 73.23 | 1584 | 3107.7 | 8.10% | 7.23% |
| $Li_{0.5}Bi_{0.5}MO_{0.4}W_{0.6}O_4$ | 30 | | | | | | | | | |
| $Na_{0.5}Bi_{0.5}MoO_4$ | 20 | 700 | 4 | | 4.431 | 16.19 | 508 | 6473.3 | 4.52% | 3.38% |
| $Na_2BiMg_2V_3O_{12}$ | 25 | 750 | 4 | | 4.178 | 24.04 | 807 | 5359.1 | 8.10% | 7.76% |
| $BaWO_4$ | 8 | 1175 | 4 | 3.73 | | | | | 11.74% | 10.44% |
| $BaWO_4$ | 8 | 1175 | 4 | 4.00 | | | | | 8.62% | 6.95% |
| $BaWO_4$ | 8 | 1175 | 4 | 3.11 | | | | | 14.44% | 12.68% |
| $Na_{0.35}Bi_{0.65}MO_{0.7}V_{0.3}O_4$ | 43 | | | | | | | | | |
| $BiVO_4$ | | | | | | | | | | |

In some embodiments, the above-disclosed ring materials can have ε' of less than 10 (or less than about 10). Thus, embodiments of the disclosure can be used for 5G below resonance applications. It can be advantageous to avoid moding and to offset the impedance effect of thinner substrates also used at high frequencies. Accordingly, values below 10 (or below about 10) are used for above 20 GHz frequencies.

5G Applications

Embodiments of the disclosed composite microstrip circulators can be particularly advantageous for $5^{th}$ generation wireless system (5G) applications, though could also be used for early 4G and 3G applications as well. 5G technology is also referred to herein as 5G New Radio (NR). 5G networks can provide for significantly higher capacities than current 4G system, which allows for a larger number of consumers in an area. This can further improve uploading/downloading limits and requirements. In particular, the large number of circulators, such as those described herein, needed for 5G (typically 1 per front end module or FEM) requires further integration of components. The disclosed embodiments of circulators can allow for this integration and thus can be particularly advantageous. Other components in the front end module will be microstrip or SMT based. Examples of integrated microstrip circulators which can be used with the materials herein are disclosed in U.S. Pat. Pub. No. 2018/0166763, the entirety of which is hereby incorporated by reference.

Preliminary specifications for 5G NR support a variety of features, such as communications over millimeter wave spectrum, beam forming capability, high spectral efficiency waveforms, low latency communications, multiple radio numerology, and/or non-orthogonal multiple access (NOMA). Although such RF functionalities offer flexibility to networks and enhance user data rates, supporting such features can pose a number of technical challenges.

The teachings herein are applicable to a wide variety of communication systems, including, but not limited to, communication systems using advanced cellular technologies, such as LTE-Advanced, LTE-Advanced Pro, and/or 5G NR.

Figure 8:
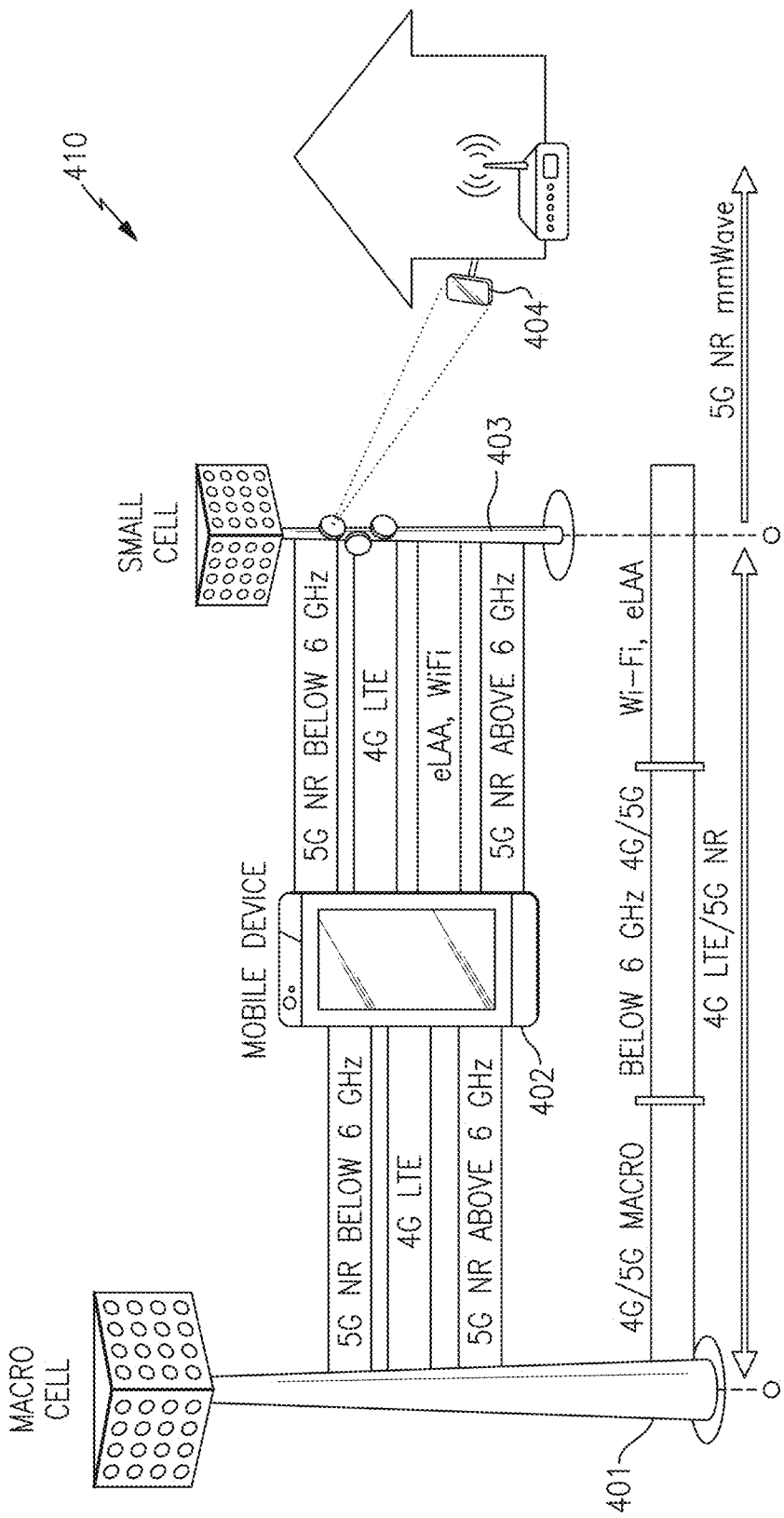
FIG. 8 is a schematic diagram of one example of a communication network.

FIG. 8 is a schematic diagram of one example of a communication network 410. The communication network 410 includes a macro cell base station 401, a mobile device 402, a small cell base station 403, and a stationary wireless device 404.

The illustrated communication network 410 of FIG. 8 supports communications using a variety of technologies, including, for example, 4G LTE, 5G NR, and wireless local area network (WLAN), such as Wi-Fi. Although various examples of supported communication technologies are shown, the communication network 410 can be adapted to support a wide variety of communication technologies.

Various communication links of the communication network 410 have been depicted in FIG. 8. The communication links can be duplexed in a wide variety of ways, including, for example, using frequency-division duplexing (FDD) and/or time-division duplexing (TDD). FDD is a type of radio frequency communications that uses different frequencies for transmitting and receiving signals. FDD can provide a number of advantages, such as high data rates and low latency. In contrast, TDD is a type of radio frequency communications that uses about the same frequency for transmitting and receiving signals, and in which transmit and receive communications are switched in time. TDD can provide a number of advantages, such as efficient use of spectrum and variable allocation of throughput between transmit and receive directions.

As shown in FIG. 8, the mobile device 402 communicates with the macro cell base station 401 over a communication link that uses a combination of 4G LTE and 5G NR technologies. The mobile device 402 also communicates with the small cell base station 403 which can include embodiments of the disclosure. In the illustrated example, the mobile device 402 and small cell base station 403 communicate over a communication link that uses 5G NR, 4G LTE, and Wi-Fi technologies.

In certain implementations, the mobile device 402 communicates with the macro cell base station 402 and the small cell base station 403 using 5G NR technology over one or more frequency bands that are less than 6 Gigahertz (GHz). In one embodiment, the mobile device 402 supports a HPUE power class specification.

The illustrated small cell base station 403, incorporating embodiments of the disclosure, also communicates with a stationary wireless device 404. The small cell base station 403 can be used, for example, to provide broadband service using 5G NR technology over one or more frequency bands above 6 GHz, including, for example, millimeter wave bands in the frequency range of 30 GHz to 300 GHz.

In certain implementations, the small cell base station 403 communicates with the stationary wireless device 404 using beamforming. For example, beamforming can be used to focus signal strength to overcome path losses, such as high loss associated with communicating over millimeter wave frequencies.

The communication network 410 of FIG. 8 includes the macro cell base station 401, which can include embodiments of the disclosure, and the small cell base station 403. In certain implementations, the small cell base station 403 can operate with relatively lower power, shorter range, and/or with fewer concurrent users relative to the macro cell base station 401. The small cell base station 403 can also be referred to as a femtocell, a picocell, or a microcell.

Although the communication network 410 is illustrated as including two base stations, the communication network 410 can be implemented to include more or fewer base stations and/or base stations of other types.

The communication network 410 of FIG. 8 is illustrated as including one mobile device and one stationary wireless device. The mobile device 402 and the stationary wireless device 404 illustrate two examples of user devices or user equipment (UE). Although the communication network 410 is illustrated as including two user devices, the communication network 410 can be used to communicate with more or fewer user devices and/or user devices of other types. For example, user devices can include mobile phones, tablets, laptops, IoT devices, wearable electronics, and/or a wide variety of other communications devices.

User devices of the communication network 410 can share available network resources (for instance, available frequency spectrum) in a wide variety of ways.

Enhanced mobile broadband (eMBB) refers to technology for growing system capacity of LTE networks. For example, eMBB can refer to communications with a peak data rate of at least 10 Gbps and a minimum of 100 Mbps for each user device. Ultra-reliable low latency communications (uRLLC) refers to technology for communication with very low latency, for instance, less than 2 ms. uRLLC can be used for mission-critical communications such as for autonomous driving and/or remote surgery applications. Massive machine-type communications (mMTC) refers to low cost and low data rate communications associated with wireless connections to everyday objects, such as those associated with Internet of Things (IoT) applications.

The communication network 410 of FIG. 8 can be used to support a wide variety of advanced communication features, including, but not limited to eMBB, uRLLC, and/or mMTC.

A peak data rate of a communication link (for instance, between a base station and a user device) depends on a variety of factors. For example, peak data rate can be affected by channel bandwidth, modulation order, a number of component carriers, and/or a number of antennas used for communications.

For instance, in certain implementations, a data rate of a communication link can be about equal to $M*B\log_2(1+S/N)$, where M is the number of communication channels, B is the channel bandwidth, and S/N is the signal-to-noise ratio (SNR).

Accordingly, data rate of a communication link can be increased by increasing the number of communication channels (for instance, transmitting and receiving using multiple antennas), using wider bandwidth (for instance, by aggregating carriers), and/or improving SNR (for instance, by increasing transmit power and/or improving receiver sensitivity).

5G NR communication systems can employ a wide variety of techniques for enhancing data rate and/or communication performance.

Figure 9:
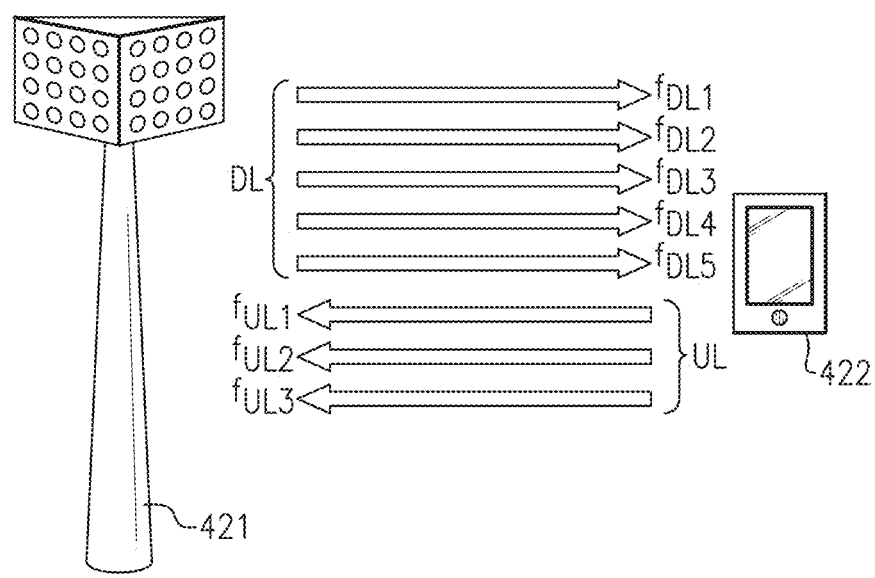
FIG. 9 is a schematic diagram of one example of a communication link using carrier aggregation.

FIG. 9 is a schematic diagram of one example of a communication link using carrier aggregation. Carrier aggregation can be used to widen bandwidth of the communication link by supporting communications over multiple frequency carriers, thereby increasing user data rates and enhancing network capacity by utilizing fragmented spectrum allocations.

In the illustrated example, the communication link is provided between a base station 421 and a mobile device 422. As shown in FIG. 9 the communications link includes a downlink channel used for RF communications from the base station 421 to the mobile device 422, and an uplink channel used for RF communications from the mobile device 422 to the base station 421.

Although FIG. 9 illustrates carrier aggregation in the context of FDD communications, carrier aggregation can also be used for TDD communications.

In certain implementations, a communication link can provide asymmetrical data rates for a downlink channel and an uplink channel. For example, a communication link can be used to support a relatively high downlink data rate to enable high speed streaming of multimedia content to a mobile device, while providing a relatively slower data rate for uploading data from the mobile device to the cloud.

In the illustrated example, the base station 421 and the mobile device 422 communicate via carrier aggregation, which can be used to selectively increase bandwidth of the communication link. Carrier aggregation includes contiguous aggregation, in which contiguous carriers within the same operating frequency band are aggregated. Carrier aggregation can also be non-contiguous, and can include carriers separated in frequency within a common band or in different bands.

In the example shown in FIG. 9, the uplink channel includes three aggregated component carriers $f_{UL1}$, $f_{UL2}$, and $f_{UL3}$. Additionally, the downlink channel includes five aggregated component carriers $f_{DL1}$, $f_{DL2}$, $f_{DL3}$, $f_{DL4}$, and $f_{DL5}$. Although one example of component carrier aggregation is shown, more or fewer carriers can be aggregated for uplink and/or downlink. Moreover, a number of aggregated carriers can be varied over time to achieve desired uplink and downlink data rates.

For example, a number of aggregated carriers for uplink and/or downlink communications with respect to a particular mobile device can change over time. For example, the number of aggregated carriers can change as the device moves through the communication network and/or as network usage changes over time.

With reference to FIG. 9, the individual component carriers used in carrier aggregation can be of a variety of frequencies, including, for example, frequency carriers in the same band or in multiple bands. Additionally, carrier aggregation is applicable to implementations in which the individual component carriers are of about the same bandwidth as well as to implementations in which the individual component carriers have different bandwidths.

Figure 10A:
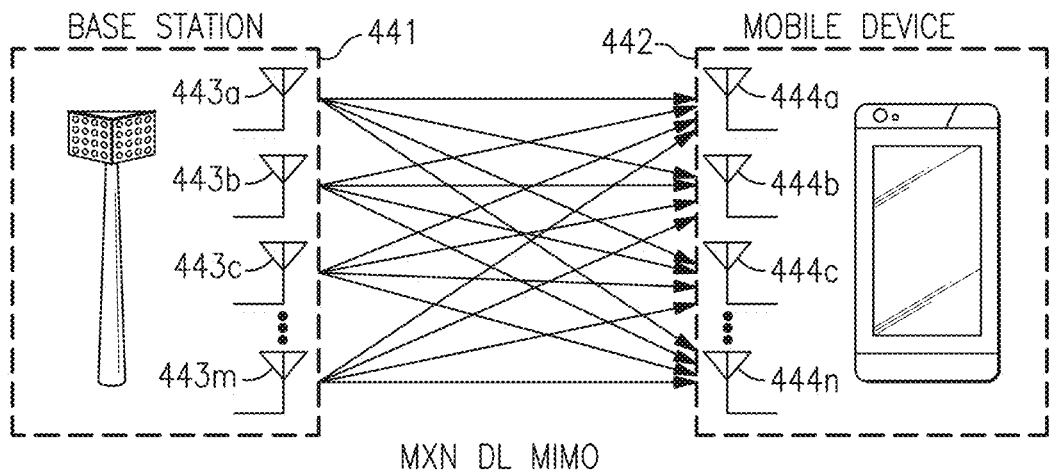
FIG. 10A is a schematic diagram of one example of a downlink channel using multi-input and multi-output (MIMO) communications.
Figure 10B:
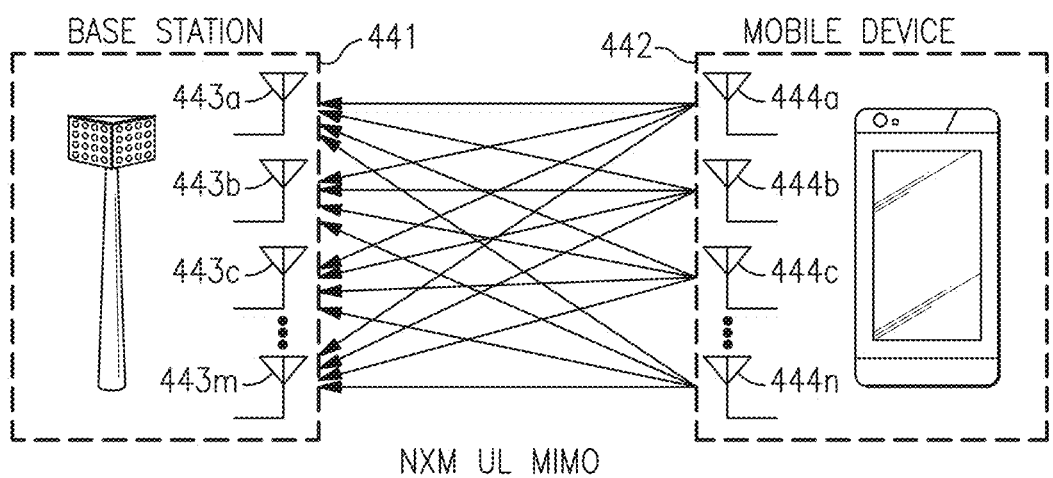
FIG. 10B is schematic diagram of one example of an uplink channel using MIMO communications.

FIG. 10A is a schematic diagram of one example of a downlink channel using multi-input and multi-output (MIMO) communications. FIG. 10B is schematic diagram of one example of an uplink channel using MIMO communications.

MIMO communications use multiple antennas for simultaneously communicating multiple data streams over common frequency spectrum. In certain implementations, the data streams operate with different reference signals to enhance data reception at the receiver. MIMO communications benefit from higher SNR, improved coding, and/or reduced signal interference due to spatial multiplexing differences of the radio environment.

MIMO order refers to a number of separate data streams sent or received. For instance, MIMO order for downlink communications can be described by a number of transmit antennas of a base station and a number of receive antennas for UE, such as a mobile device. For example, two-by-two (2×2) DL MIMO refers to MIMO downlink communications using two base station antennas and two UE antennas. Additionally, four-by-four (4×4) DL MIMO refers to MIMO downlink communications using four base station antennas and four UE antennas.

In the example shown in FIG. 10A, downlink MIMO communications are provided by transmitting using M antennas 443a, 443b, 443c, . . . 443m of the base station 41 and receiving using N antennas 444a, 444b, 444c, . . . 444n of the mobile device 442. Accordingly, FIG. 10A illustrates an example of M×N DL MIMO.

Likewise, MIMO order for uplink communications can be described by a number of transmit antennas of UE, such as a mobile device, and a number of receive antennas of a base station. For example, 2×2 UL MIMO refers to MIMO uplink communications using two UE antennas and two base station antennas. Additionally, 4×4 UL MIMO refers to MIMO uplink communications using four UE antennas and four base station antennas.

In the example shown in FIG. 10B, uplink MIMO communications are provided by transmitting using N antennas 444a, 444b, 444c, . . . 444n of the mobile device 442 and receiving using M antennas 443a, 443b, 443c, . . . 443m of the base station 441. Accordingly, FIG. 10B illustrates an example of N×M UL MIMO.

By increasing the level or order of MIMO, bandwidth of an uplink channel and/or a downlink channel can be increased.

Although illustrated in the context of FDD, MIMO communications are also applicable communication links using TDD.

For these 5G networks, one form of base station will be massive multiple input, multiple output (MIMO) based, with an array of perhaps 64-128 antennas capable of multi-beam forming to interact with handheld terminals at very high data rates. Thus, embodiments of the disclosure can be incorporated into the base stations to provide for high capacity applications.

This approach is similar to radar phased array T/R modules, with individual transceivers for each antenna element, although massive MIMO is not a phased array in the radar sense. The objective is optimum coherent signal strength at the terminal(s) rather than direction finding. Further, signal separation will be time division (TD) based, requiring a means of duplexing/switching to separate Tx and Rx signals For discussion, it is assumed that there is one Tx, one Rx module, one duplexing circulator and one antenna filter per antenna. However, other configurations can be used as well.

FIG. 8 shows a simplified version of an RF transmission system, omitting drivers and switching logic. As shown, the system can include a number of different components, including a circulator. Thus, embodiments of the disclosure can be used as the circulator in the RF system, either for newly created systems or as improved replacements for the previous systems. Specifically, embodiments of the disclosure relate to hybrid solutions using a stripline circulator, and microstrip or stripline topology for the remaining components.

FIG. 9 illustrates the integrated component of FIGS. 5A-B discussed above onto the simplified RF antenna structure. As shown, the substrate can include the co-fired ferrite/dielectric tile for the circulator. In addition, a coupler, switch, and load can also be applied to the dielectric tile outside of the ferrite. The conductors and the ground plane could be in a thick film silver. In some embodiments, the circulator subassembly can also be integrated with the power amplifier (PA) and loud noise amplifier (LNA) modules.

Embodiments of the disclosure can have advantages over circulators known in the art. For example,
- Couplers and other transmission lines have much lower insertion loss compared with other couplers, such as semiconductor couplers
- Coupling is more consistent
- Loads can dissipate heat more easily compared with soft substrate
- Circulators have lower loss than all-ferrite substrate based devices
- The dielectric is temperature stable, assisting the coupler and circulator's performance
- The size of the devices can be reduced by using higher dielectric constant ceramic dielectric if required Further, embodiments of the ceramic circulator can have the following advantages:
- Heat/power dissipation/thermal conductivity for PA and load
- Isotropic dielectric (except TTB) for coupler/filter design
- Range of dielectric constant (4-100+) for size reduction
- Low dielectric loss (coupler/filter)
- Tight dielectric constant tolerance (coupler/filter/antenna)
- Stable dielectric constant over temperature (coupler/filter/circulator)
- Modest Cost On the other hand, soft substrate (e.g., softboards) can have the following disadvantages:
- Poor conductivity due to plastic conductivity
- Anisotropic (xy versus z direction)
- Only 3-10 with some, fixed with others
- Higher losses
- Looser tolerances
- Unstable over temperature Accordingly, embodiments of the disclosure can have significant advantages over circulators previously known in the art.

Figure 11:
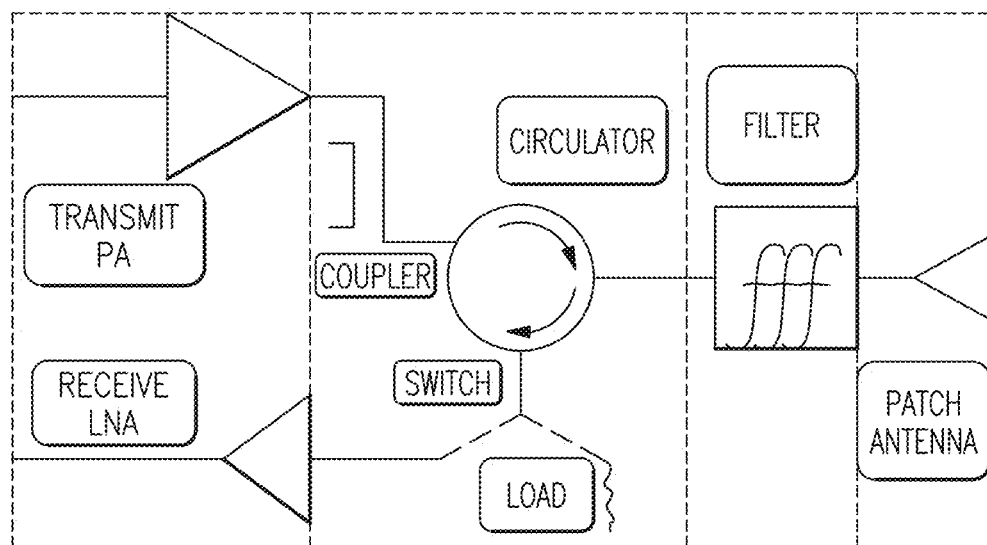
FIG. 11 illustrates a schematic of an antenna system.
Figure 12:
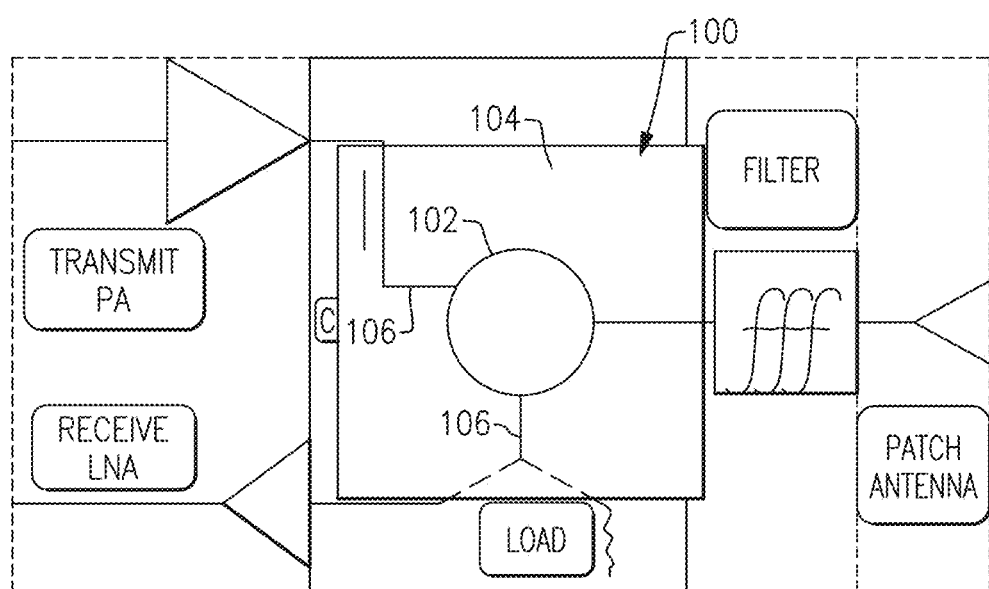
FIG. 12 illustrates a schematic of an antenna system with an embodiment of an integrated microstrip circulator.
Figure 13:
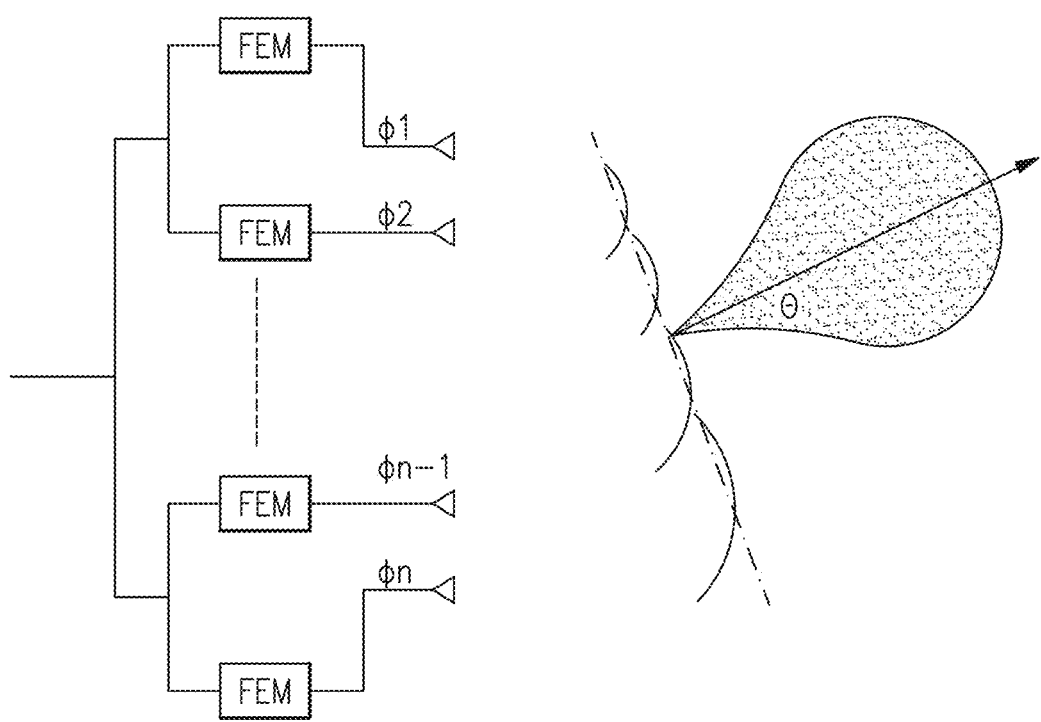
FIG. 13 illustrates a MIMO system incorporating embodiments of the disclosure.

FIG. 13 illustrates another embodiment of a MIMO system that the disclosed microstrip circulators can be incorporated into. With the advent of massive MIMO for 5G system the current antennas will be replaced with antenna arrays with, for example, 64 array elements. Each element can be fed by a separate front end module (FEM) including the blocks shown in FIGS. 11 and 12 in which embodiments of the microstrip circulator formed on the co-fired tile can be an integral component.

Figure 14:
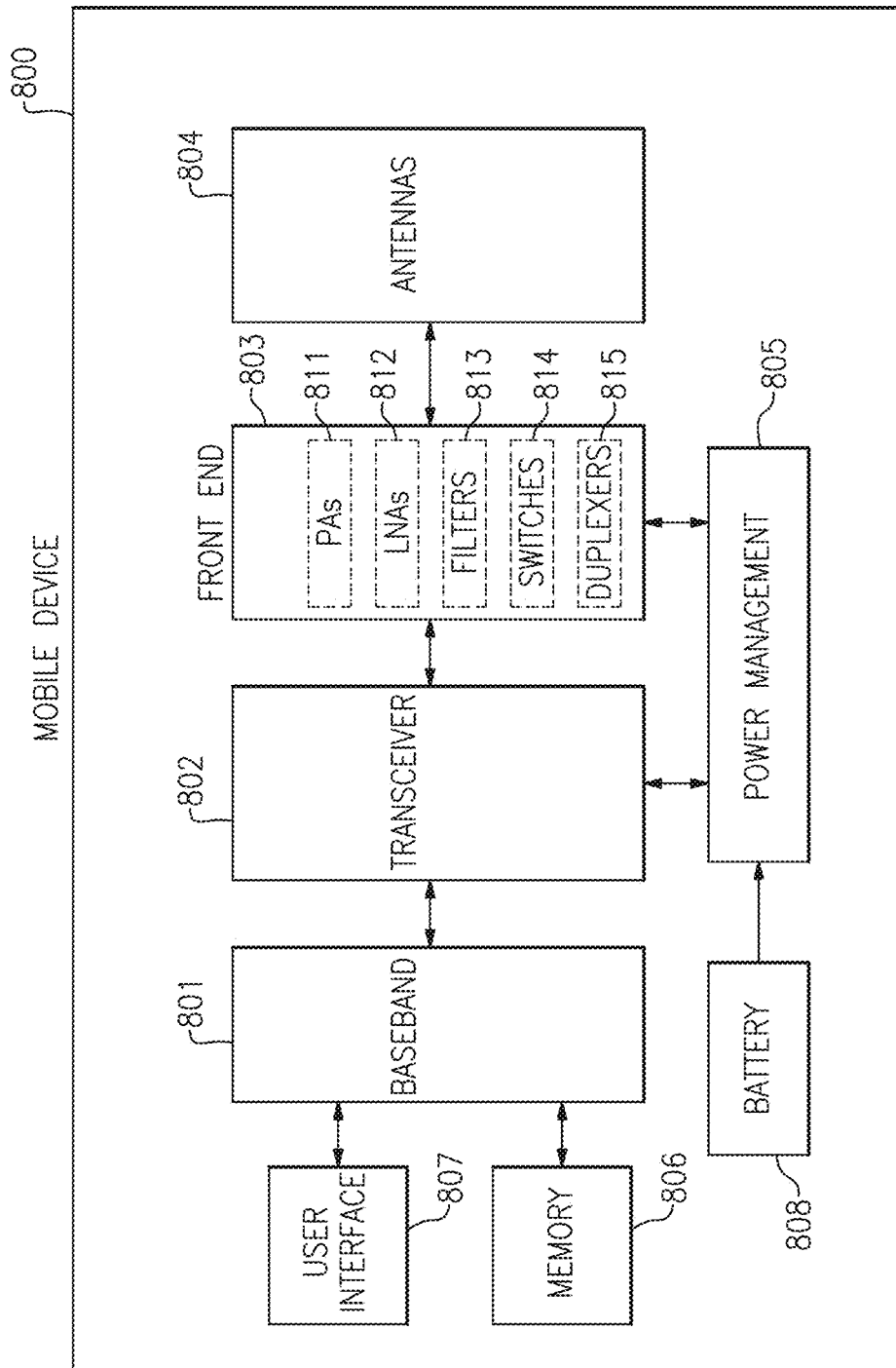
FIG. 14 is a schematic diagram of one example of a mobile device.

FIG. 14 is a schematic diagram of one example of a mobile device 800. The mobile device 800 includes a baseband system 801, a transceiver 802, a front end system 803, antennas 804, a power management system 805, a memory 806, a user interface 807, and a battery 808 and can interact with the base stations including embodiments of the microstrip circulators disclosed herein.

The mobile device 800 can be used communicate using a wide variety of communications technologies, including, but not limited to, 2G, 3G, 4G (including LTE, LTE-Advanced, and LTE-Advanced Pro), 5G NR, WLAN (for instance, Wi-Fi), WPAN (for instance, Bluetooth and ZigBee), and/or GPS technologies.

The transceiver 802 generates RF signals for transmission and processes incoming RF signals received from the antennas 804. It will be understood that various functionalities associated with the transmission and receiving of RF signals can be achieved by one or more components that are collectively represented in FIG. 14 as the transceiver 802. In one example, separate components (for instance, separate circuits or dies) can be provided for handling certain types of RF signals.

In certain implementations, the mobile device 800 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 804 can include antennas used for a wide variety of types of communications. For example, the antennas 804 can include antennas associated transmitting and/or receiving signals associated with a wide variety of frequencies and communications standards.

In certain implementations, the antennas 804 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

Figure 15:
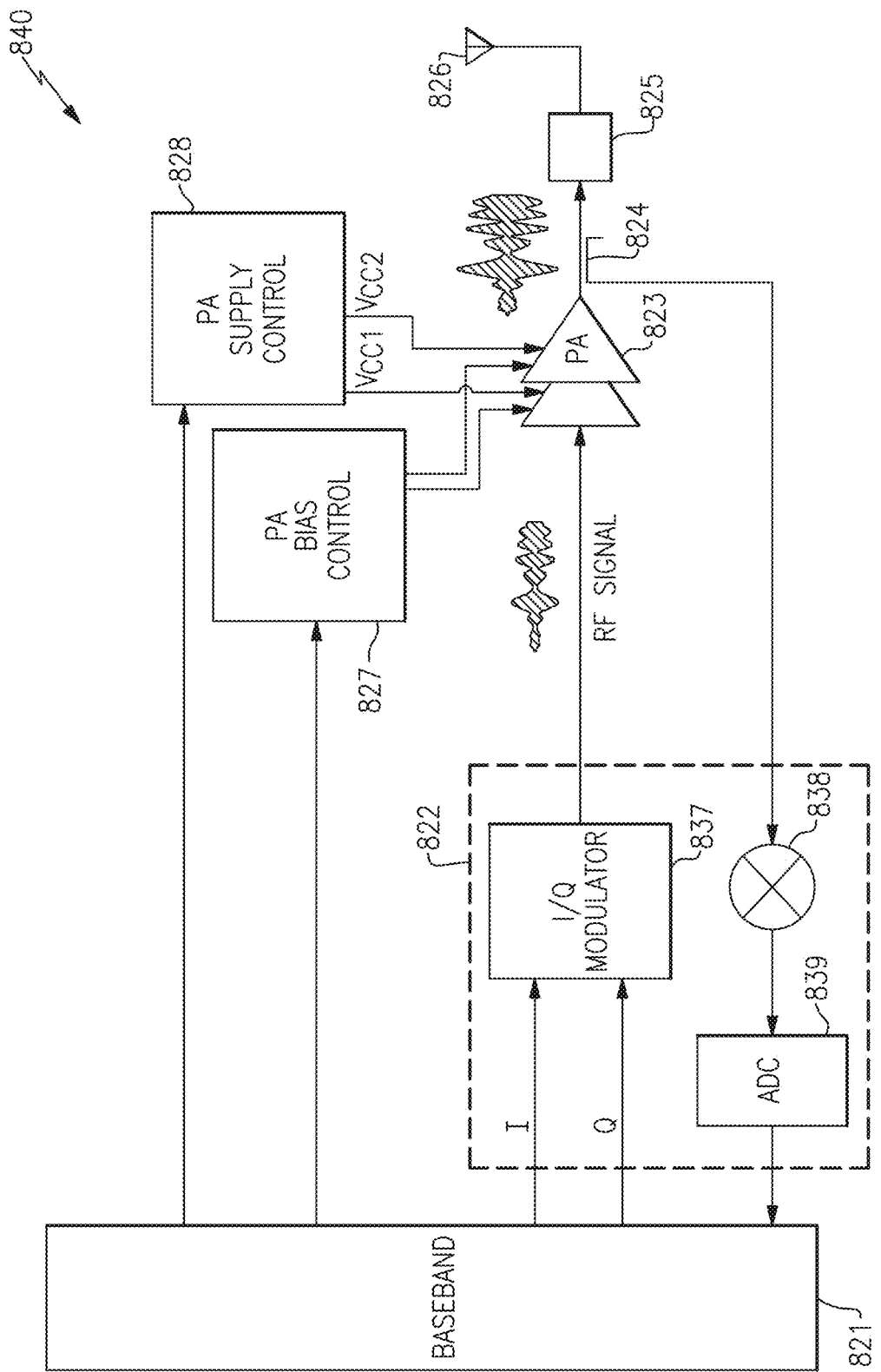
FIG. 15 is a schematic diagram of a power amplifier system according to one embodiment.

FIG. 15 is a schematic diagram of a power amplifier system 840 according to one embodiment. The illustrated power amplifier system 840 includes a baseband processor 821, a transmitter 822, a power amplifier (PA) 823, a directional coupler 824, a bandpass filter 825, an antenna 826, a PA bias control circuit 827, and a PA supply control circuit 828. The illustrated transmitter 822 includes an I/Q modulator 837, a mixer 838, and an analog-to-digital converter (ADC) 839. In certain implementations, the transmitter 822 is included in a transceiver such that both transmit and receive functionality is provided. Embodiments of the disclosed microstrip circulators can be incorporated into the power amplifier system.

Methodology

Figure 16:
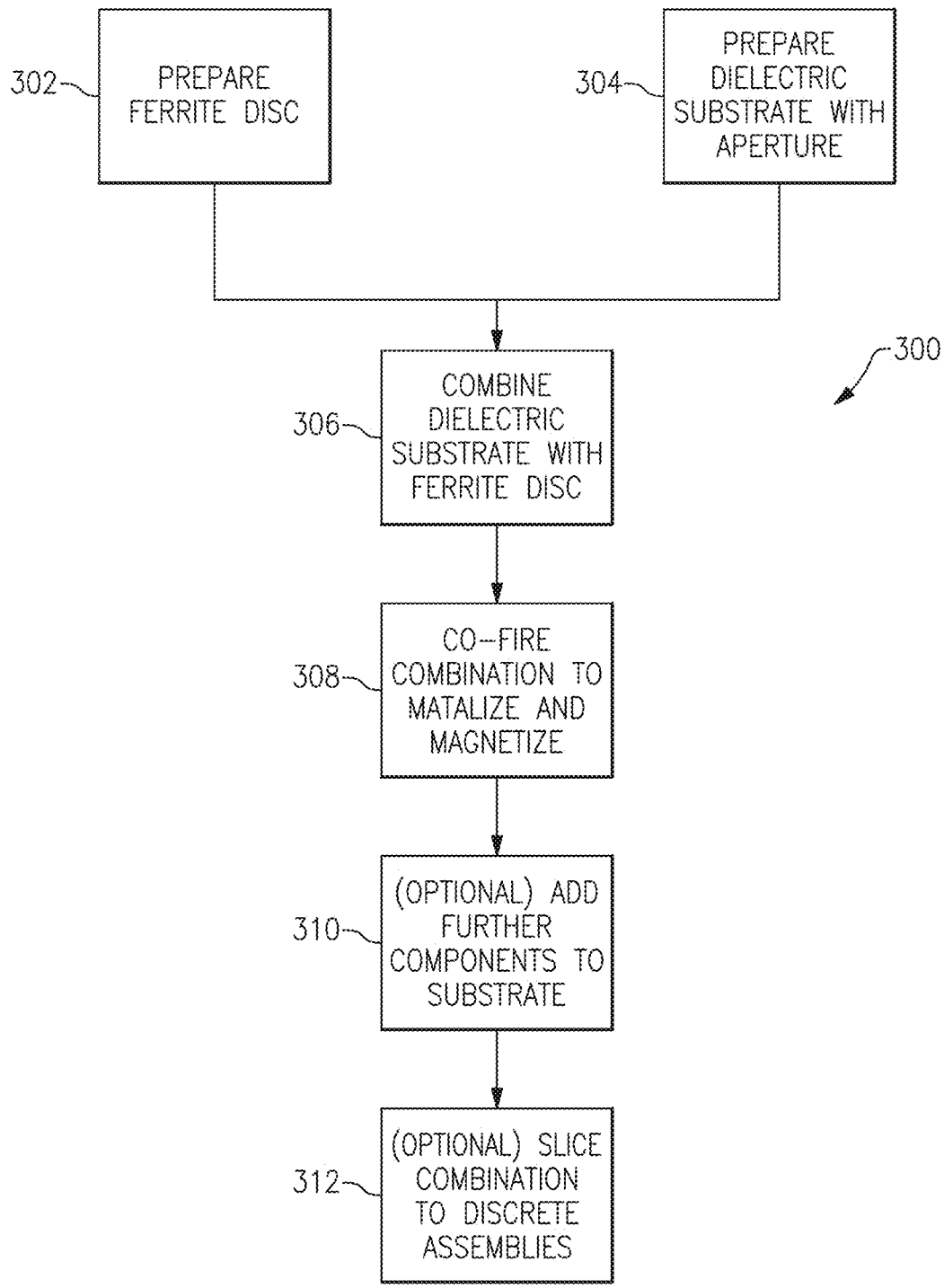
FIG. 16 illustrates a method of forming a composite integrated microstrip circulator.

Disclosed herein are embodiments of a process for making an integrated microstrip component. FIG. 16 discloses an embodiment of a process 300 that can be used.

Returning to FIG. 16, at step 302, a ferrite disc or cylinder can be formed from a magnetic ceramic material by any suitable conventional process known in the art for making such elements, i.e., magnetic oxides of the types used in high frequency electronic components. Similarly, at step 304, a substrate can be formed from a dielectric material by any suitable conventional process. In some embodiments, the ferrite disc can be sintered by firing it in a kiln. Some examples of materials and firing temperatures are set forth below, following this process flow description. However, persons skilled in the art to which the invention relates understand that the materials and processes by which magnetic ceramic and dielectric ceramic elements of this type are made are well known in the art. Therefore, suitable materials and temperatures are not listed exhaustively. All such suitable materials and process for making such rods, cylinders and similar elements of this type are intended to be within the scope of the invention.

At step 306, the disc can be combined into the dielectric substrate with the aperture. For example, the outside surface of the disc can be machined to ensure it is of an outside diameter (OD) that is less than the inside diameter (ID) of the substrate aperture. In some embodiments, the OD is slightly smaller than the ID to enable the disc to be inserted into the substrate.

In some embodiments, the pre-fired disc can be received in an unfired or "green" substrate to form the composite assembly 100 shown in FIGS. 4A-B.

At step 308, the disc and substrate can be co-fired. That is, composite assembly 100 is fired. The co-firing temperature can be lower than the temperature at which disc was fired, to ensure that the physical and electrical properties of the disc remain unchanged. The co-firing temperature can be within the well-known range in which such components are conventionally fired. Importantly, co-firing causes the substrate to shrink around the disc, thereby securing them together. Afterwards, the outside surface of the composite assembly 100 can then be machined to ensure it is of a specified or otherwise predetermined OD. Further, this step can be used to metalize and/or magnetize the composite assembly 100 if the ferrite disc has not previously been magnetized.

Steps 310 and 312 show optional steps that can be taken after the co-firing of the composite assembly 100. For example, additional components can be added 310 onto the substrate, such as circuitry, to form final electronic components. Further, in some embodiments the composite assembly 100 can be sliced 312, or otherwise partitioned, to form a number of discrete assemblies. In some embodiments, both these optional steps can be performed and the particular order is not limiting. In some embodiments, only one of the optional steps can be taken. In some embodiments, neither of the optional steps can be taken.

Accordingly, composite assemblies 100 can be used in manufacturing high frequency electronic components in the same manner as conventionally-produced assemblies of this type. However, the method of the present invention is more economical than conventional methods, as the invention does not involve the use of adhesives.

Figure 17:
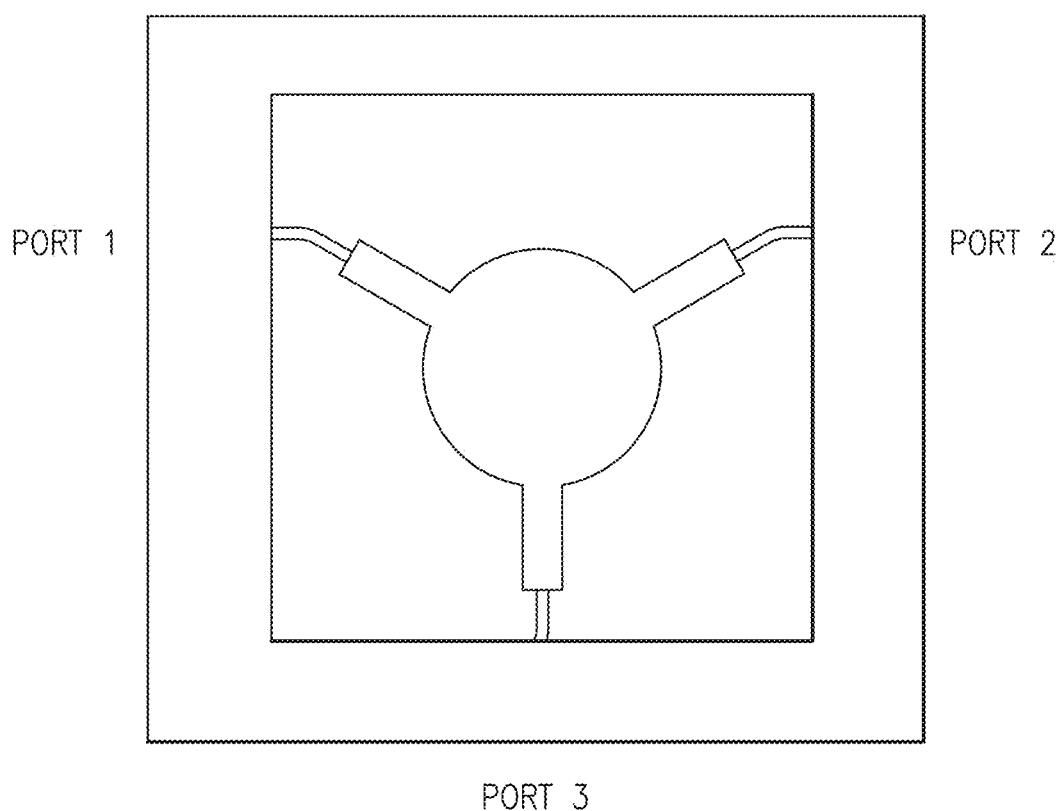
FIG. 17 illustrates an embodiment of an integrated microstrip circulator for testing.

FIG. 17 illustrates an example embodiment of a circulator as discussed herein. Thick film silver can be printed as the circuit. As per standard circulator applications, the circulator includes Port 1, Port 2, and Port 3. One of these ports can be blocked off to form an isolator.

Telecommunication Base Station

Circuits and devices having one or more features as described herein can be implemented in RF applications such as a wireless base-station. Such a wireless base-station can include one or more antennas configured to facilitate transmission and/or reception of RF signals. Such antenna(s) can be coupled to circuits and devices having one or more circulators/isolators as described herein.

Figure 18:
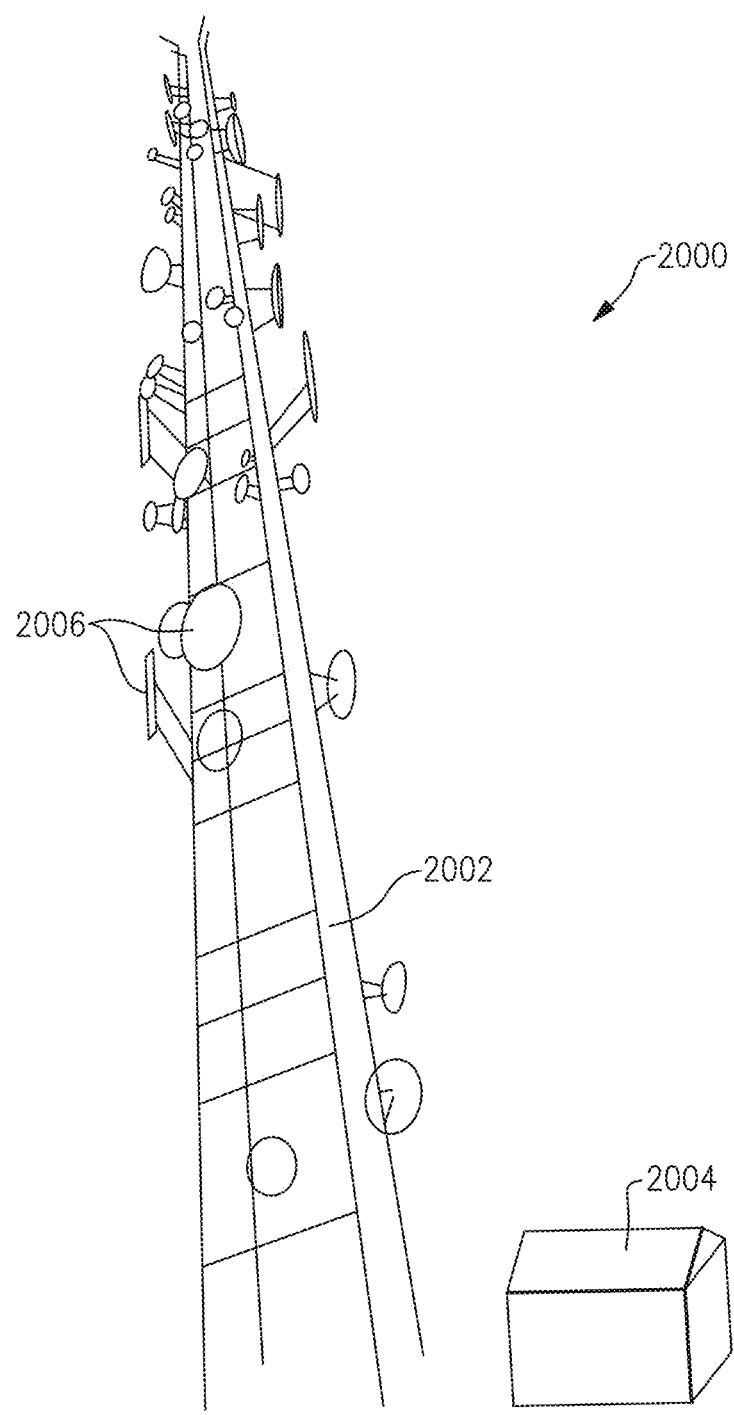
FIG. 18 illustrates a perspective view of a cellular antenna base station incorporating embodiments of the disclosure.

Thus, in some embodiments, the above disclosed material can be incorporated into different components of a telecommunication base station, such as used for cellular networks and wireless communications. An example perspective view of a base station 2000 is shown in FIG. 18, including both a cell tower 2002 and electronics building 2004. The cell tower 2002 can include a number of antennas 2006, typically facing different directions for optimizing service, which can be used to both receive and transmit cellular signals while the electronics building 2004 can hold electronic components such as filters, amplifiers, etc. discussed below. Both the antennas 2006 and electronic components can incorporate embodiments of the disclosed ceramic materials.

Figure 19:
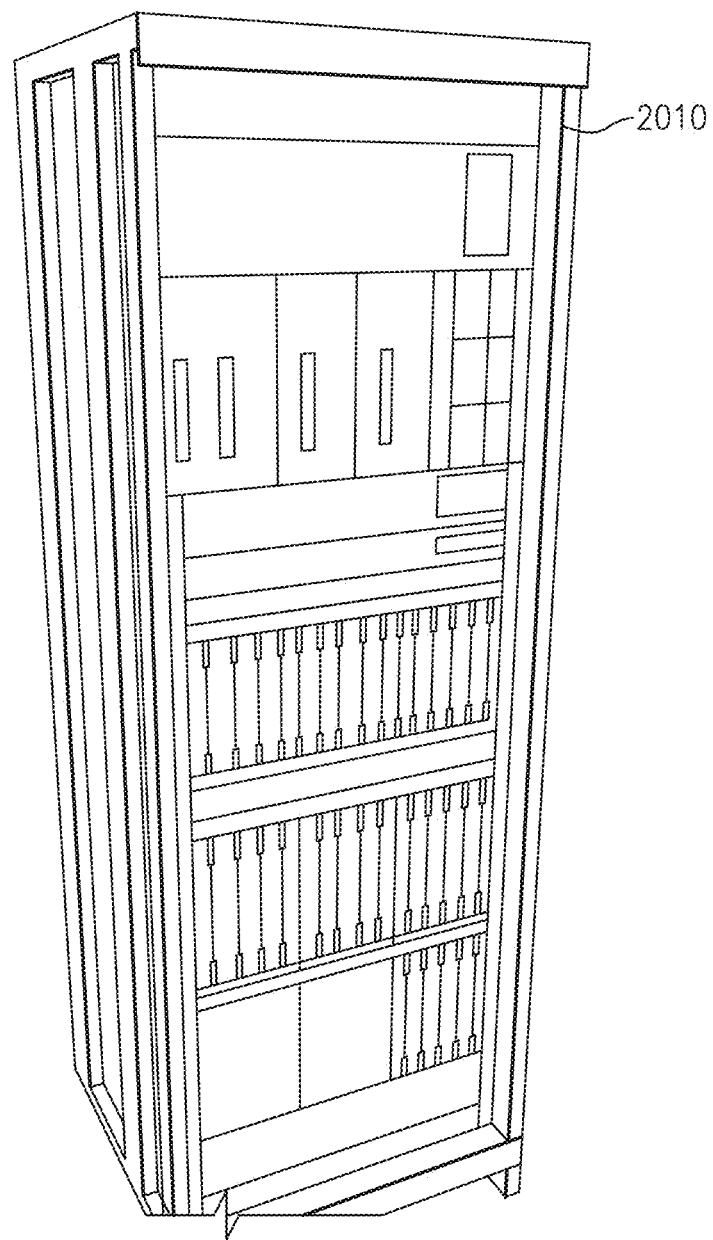
FIG. 19 illustrates housing components of a base station incorporating embodiments of the disclosed material.

FIG. 19 shows a base station 2010. The base station can include an antenna that is configured to facilitate transmission and/or reception of RF signals. Such signals can be generated by and/or processed by a transceiver. For transmission, the transceiver can generate a transmit signal that is amplified by a power amplifier (PA) and filtered (Tx Filter) for transmission by the antenna. For reception, a signal received from the antenna can be filtered (Rx Filter) and amplified by a low-noise amplifier (LNA) before being passed on to the transceiver. In the example context of such Tx and Rx paths, circulators and/or isolators having one or more features as described herein can be implemented at or in connection with, for example, the PA circuit and the LNA circuit. The circulators and isolators can include embodiments of the material disclosed herein. Further, the antennas can include the materials disclosed herein, allowing them to work on higher frequency ranges.

Figure 20:
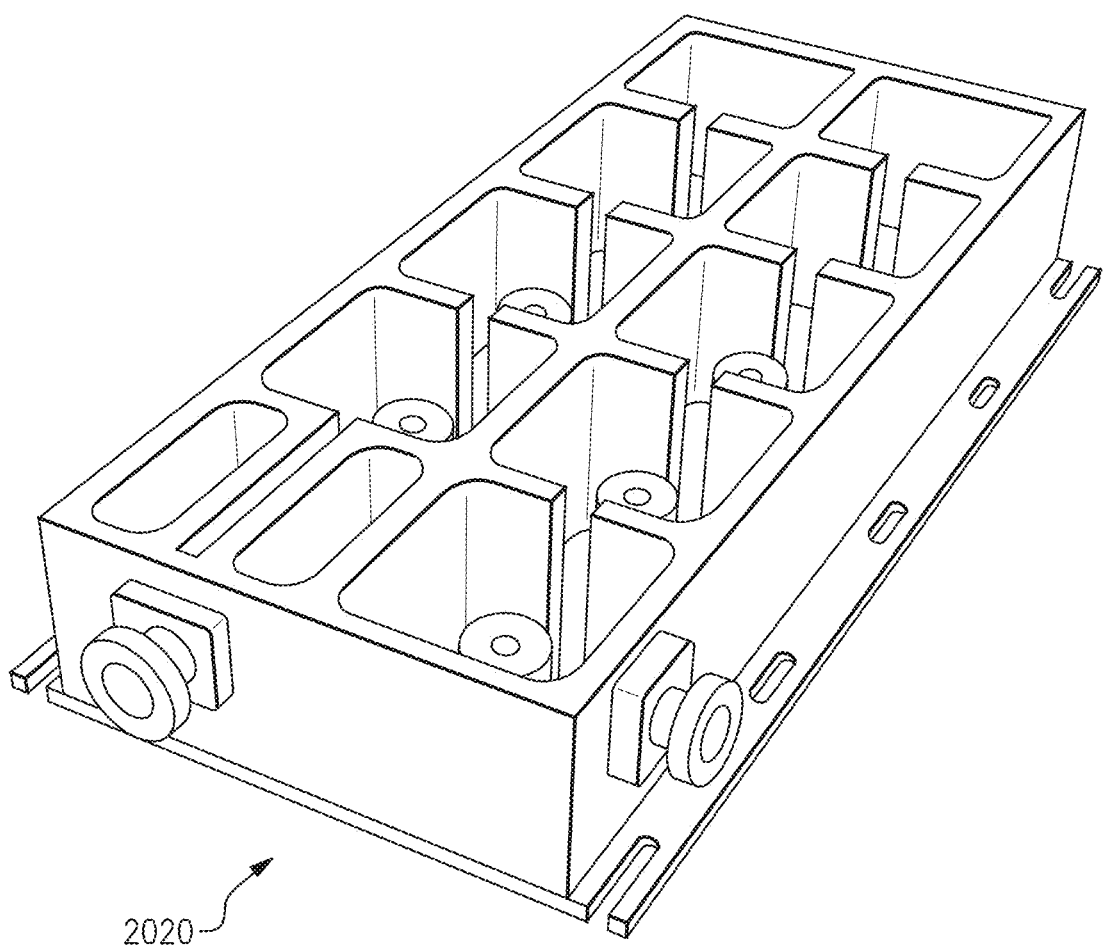
FIG. 20 illustrates a cavity filter used in a base station incorporating embodiments of the material disclosed herein.

FIG. 20 illustrates hardware 2020 that can be used in the electronics building 2004, and can include the components discussed above with respect to FIG. 12. For example, the hardware 2020 can be a base station subsystem (BSS), which can handle traffic and signaling for the mobile systems.

Figure 21:
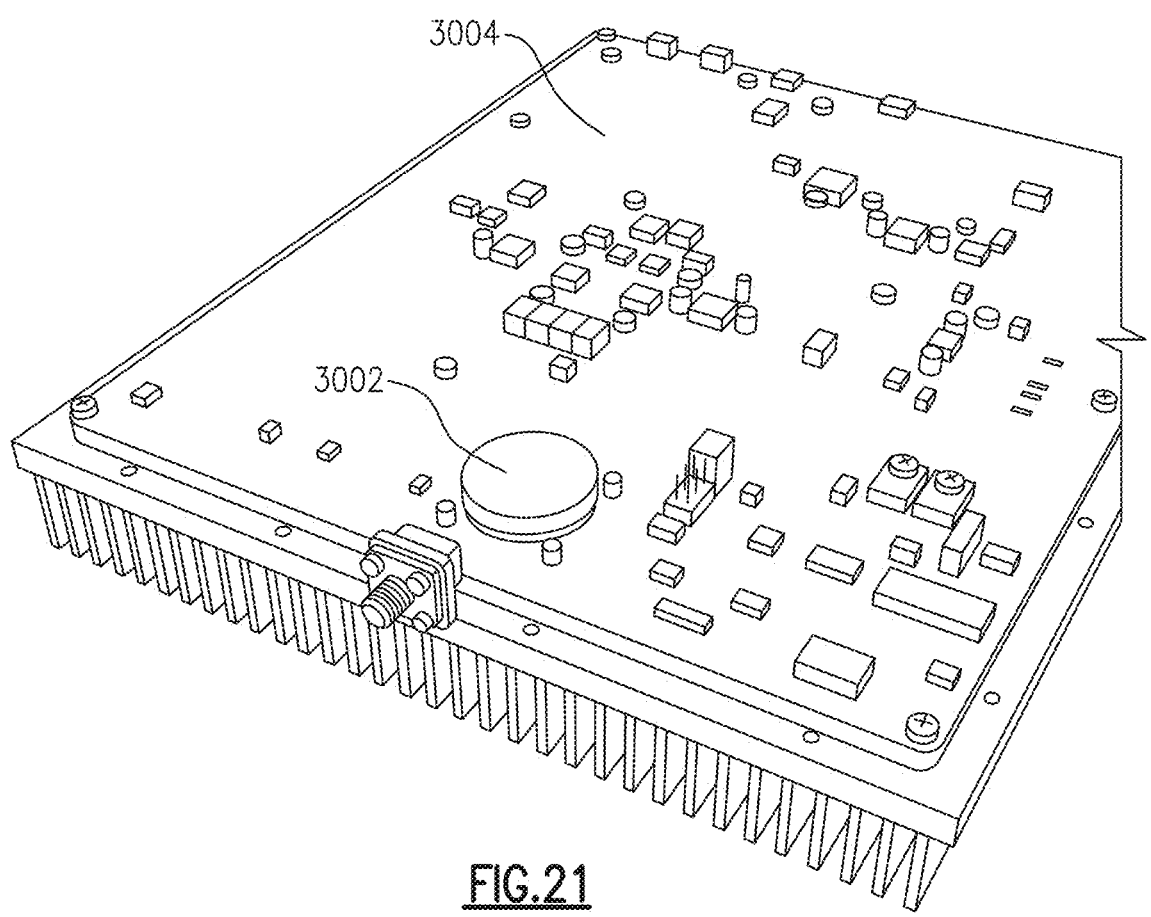
FIG. 21 illustrates an embodiment of a circuit board including embodiments of the material disclosed herein.

FIG. 21 illustrates a further detailing of the hardware 2020 discussed above. Specifically, FIG. 21 depicts a circuit board 3004 having a cavity filter/combiner 3002 which can be incorporated into the base station. The cavity filter 3002 can include, for example, bandpass filters such as those incorporating embodiments of the disclosed material, and can allow the output of two or more transmitters on different frequencies to be combined.

From the foregoing description, it will be appreciated that inventive products and approaches for composite microstrip circulators/isolators are disclosed. While several components, techniques and aspects have been described with a certain degree of particularity, it is manifest that many changes can be made in the specific designs, constructions and methodology herein above described without departing from the spirit and scope of this disclosure.

Certain features that are described in this disclosure in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations, one or more features from a claimed combination can, in some cases, be excised from the combination, and the combination may be claimed as any subcombination or variation of any subcombination.

Moreover, while methods may be depicted in the drawings or described in the specification in a particular order, such methods need not be performed in the particular order shown or in sequential order, and that all methods need not be performed, to achieve desirable results. Other methods that are not depicted or described can be incorporated in the example methods and processes. For example, one or more additional methods can be performed before, after, simultaneously, or between any of the described methods. Further, the methods may be rearranged or reordered in other implementations. Also, the separation of various system components in the implementations described above should not be understood as requiring such separation in all implementations, and it should be understood that the described components and systems can generally be integrated together in a single product or packaged into multiple products. Additionally, other implementations are within the scope of this disclosure.

Conditional language, such as "can," "could," "might," or "may," unless specifically stated otherwise, or otherwise understood within the context as used, is generally intended to convey that certain embodiments include or do not include, certain features, elements, and/or steps. Thus, such conditional language is not generally intended to imply that features, elements, and/or steps are in any way required for one or more embodiments.

Conjunctive language such as the phrase "at least one of X, Y, and Z," unless specifically stated otherwise, is otherwise understood with the context as used in general to convey that an item, term, etc. may be either X, Y, or Z. Thus, such conjunctive language is not generally intended to imply that certain embodiments require the presence of at least one of X, at least one of Y, and at least one of Z.

Language of degree used herein, such as the terms "approximately," "about," "generally," and "substantially" as used herein represent a value, amount, or characteristic close to the stated value, amount, or characteristic that still performs a desired function or achieves a desired result. For example, the terms "approximately", "about", "generally," and "substantially" may refer to an amount that is within less than or equal to 10% of, within less than or equal to 5% of, within less than or equal to 1% of, within less than or equal to 0.1% of, and within less than or equal to 0.01% of the stated amount. If the stated amount is 0 (e.g., none, having no), the above recited ranges can be specific ranges, and not within a particular % of the value. For example, within less than or equal to 10 wt./vol. % of, within less than or equal to 5 wt./vol. % of, within less than or equal to 1 wt./vol. % of, within less than or equal to 0.1 wt./vol. % of, and within less than or equal to 0.01 wt./vol. % of the stated amount.

Some embodiments have been described in connection with the accompanying drawings. The figures are drawn to scale, but such scale should not be limiting, since dimensions and proportions other than what are shown are contemplated and are within the scope of the disclosed inventions. Distances, angles, etc. are merely illustrative and do not necessarily bear an exact relationship to actual dimensions and layout of the devices illustrated. Components can be added, removed, and/or rearranged. Further, the disclosure herein of any particular feature, aspect, method, property, characteristic, quality, attribute, element, or the like in connection with various embodiments can be used in all other embodiments set forth herein. Additionally, it will be recognized that any methods described herein may be practiced using any device suitable for performing the recited steps.

While a number of embodiments and variations thereof have been described in detail, other modifications and methods of using the same will be apparent to those of skill in the art. Accordingly, it should be understood that various applications, modifications, materials, and substitutions can be made of equivalents without departing from the unique and inventive disclosure herein or the scope of the claims.

What is claimed is:

1. A composite material comprising:
    an outer material; and
    an inner material positioned within the outer material and configured to be fired together with the outer material causing the outer material to shrink around the inner material and to hold the inner material in place within the outer material, the inner material having a dielectric constant exceeding 20 while the outer material has a dielectric constant that is less than 30.

2. The composite material of claim 1 wherein the outer material is further configured to hold the inner material in place using an adhesive.

3. The composite material of claim 1 wherein the outer material is further configured to hold the inner material in place without using an adhesive.

4. The composite material of claim 1 wherein the outer material is a dielectric substrate.

5. The composite material of claim 1 wherein the inner material is a ferrite material.

6. The composite material of claim 5 wherein the ferrite material is made of yttrium iron garnet.

7. The composite material of claim 1 wherein the inner material is shaped like a disk or a cylinder.

8. The composite material of claim 1 wherein the outer material further includes a binder blended into the outer material.

9. The composite material of claim 1 wherein a firing temperature of the inner material and a firing temperature of an outer material is between 650 and 900° C.

10. The composite material of claim 1 wherein the outer material is barium tungstate having a chemical formula $BaWO_4$.

11. The composite material of claim 10 wherein the barium tungstate is modified with $MgAl_2O_4$ or $CoAl_2O_4$.

12. A radiofrequency circulator comprising:
    a first port;
    a second port;
    a third port; and
    a composite material configured as a circulator and in communication with the first port, the second port, and the third port, the composite material including an outer material and an inner material positioned within the outer material and configured to be fired together with the outer material causing the outer material to shrink around the inner material and to hold the inner material in place within the outer material, the inner material having a dielectric constant exceeding 20 while the outer material has a dielectric constant that is less than 30.

13. The radiofrequency circulator of claim 12 wherein one of the first port, the second port, or the third port is terminated to form an isolator.

14. The radiofrequency circulator of claim 12 wherein the outer material is a dielectric substrate and the inner material is a ferrite material.

15. The radiofrequency circulator of claim 14 wherein the ferrite material is made of yttrium iron garnet.

16. The radiofrequency circulator of claim 12 wherein the outer material is further configured to hold the inner material in place without using an adhesive.

17. The radiofrequency circulator of claim 12 wherein the outer material has one of:
- a composition $Bi_{1-2x}A_{2x}V_{1-x}M_xO_4$, A being Li, Na, K, or combinations thereof, M being Mo, W, or combinations thereof, and x being between 0 and 0.45; or
- a composition $C_2BiD_2V_3O_{12}$, C being Li, Na, K, or combinations thereof and D being Mg, Zn, Co, Ni, Cu, or combinations thereof.

18. A wireless device comprising:
an antenna; and
a front-end module in communication with the antenna and including a radiofrequency circulator, the radiofrequency circulator including a plurality of ports and a composite material configured as a circulator and in communication with the plurality of ports, the composite material including an outer material and an inner material positioned within the outer material and configured to be fired together with the outer material causing the outer material to shrink around the inner material and to hold the inner material in place within the outer material, the inner material having a dielectric constant exceeding 20 while the outer material has a dielectric constant that is less than 30.

19. The wireless device of claim 18 wherein the outer material is further configured to hold the inner material in place without using an adhesive.

20. The wireless device of claim 18 wherein the outer material has one of:
- a composition $Bi_{1-2x}A_{2x}V_{1-x}M_xO_4$, A being Li, Na, K, or combinations thereof, M being Mo, W, or combinations thereof, and x being between 0 and 0.45; or
- a composition $C_2BiD_2V_3O_{12}$, C being Li, Na, K, or combinations thereof and D being Mg, Zn, Co, Ni, Cu, or combinations thereof.

* * * * *